(12) United States Patent
Yamamoto et al.

(10) Patent No.: US 9,450,198 B2
(45) Date of Patent: Sep. 20, 2016

(54) ORGANIC ELECTROLUMINESCENT MATERIALS AND DEVICES

(71) Applicant: Universal Display Corporation, Ewing, NJ (US)

(72) Inventors: Hitoshi Yamamoto, Pennington, NJ (US); Michael S. Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/253,804

(22) Filed: Apr. 15, 2014

(65) Prior Publication Data

US 2015/0295199 A1 Oct. 15, 2015

(51) Int. Cl.
*H05B 33/14* (2006.01)
*H01L 51/50* (2006.01)

(52) U.S. Cl.
CPC ....... *H01L 51/5036* (2013.01); *H01L 51/5016* (2013.01); *H01L 51/5024* (2013.01)

(58) Field of Classification Search
CPC ....................... H01L 51/5016; H01L 51/5281
USPC ........................................................ 313/504
See application file for complete search history.

(56) References Cited

U.S. PATENT DOCUMENTS

| 4,769,292 A | 9/1988 | Tang et al. |
|---|---|---|
| 5,061,569 A | 10/1991 | VanSlyke et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |

(Continued)

FOREIGN PATENT DOCUMENTS

| EP | 0650955 | 5/1995 |
|---|---|---|
| EP | 1238981 | 9/2002 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Christopher Raabe
(74) *Attorney, Agent, or Firm* — Duane Morris LLP

(57) ABSTRACT

An OLED includes a suppression mechanism and multiple dopants in its organic emissive layer. The organic emissive layer includes a host, a first compound capable of phosphorescent emission at room temperature, and a second compound capable of phosphorescent emission at room temperature. The suppression mechanism is capable of preferentially reducing the emission of light emitted by the second compound. The organic emissive layer may also contain a third compound capable of phosphorescent emission at room temperature.

18 Claims, 16 Drawing Sheets

(56) References Cited

U.S. PATENT DOCUMENTS

| | | | |
|---|---|---|---|
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,230,107 B1 | 6/2007 | Herron et al. | |
| 7,232,618 B2 | 6/2007 | Yamada et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 7,655,323 B2 | 2/2010 | Walters et al. | |
| 7,968,146 B2 | 6/2011 | Wanger et al. | |
| 8,330,351 B2 | 12/2012 | Adamovich et al. | |
| 2001/0015432 A1 | 8/2001 | Igarashi | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0072964 A1 | 4/2003 | Kwong et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0115476 A1 | 6/2004 | Oshiyama et al. | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0123751 A1 | 6/2005 | Tsutsui et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0105198 A1* | 5/2006 | Spindler et al. | 428/690 |
| 2006/0121308 A1 | 6/2006 | Katoh et al. | |
| 2006/0127696 A1 | 6/2006 | Stossel et al. | |
| 2006/0182992 A1 | 8/2006 | Nii et al. | |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0001587 A1* | 1/2007 | Hatwar et al. | 313/504 |
| 2007/0087321 A1 | 4/2007 | Pribenszky et al. | |
| 2007/0103060 A1 | 5/2007 | Itoh et al. | |
| 2007/0111026 A1 | 5/2007 | Deaton et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0261076 A1 | 10/2008 | Kwong et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2009/0302743 A1 | 12/2009 | Kato et al. | |
| 2009/0309488 A1 | 12/2009 | Kato et al. | |
| 2010/0012931 A1 | 1/2010 | Kato et al. | |
| 2010/0084966 A1 | 4/2010 | Otsu et al. | |
| 2010/0090591 A1 | 4/2010 | Alleyne et al. | |
| 2010/0148663 A1 | 6/2010 | Tsai et al. | |
| 2010/0187984 A1 | 7/2010 | Lin et al. | |
| 2010/0244004 A1 | 9/2010 | Xia et al. | |
| 2010/0295032 A1 | 11/2010 | Kwong et al. | |
| 2011/0057559 A1 | 3/2011 | Xia et al. | |
| 2011/0163302 A1 | 7/2011 | Lin et al. | |
| 2011/0204333 A1 | 8/2011 | Xia et al. | |
| 2013/0026452 A1 | 1/2013 | Kottas et al. | |
| 2013/0119354 A1 | 5/2013 | Ma et al. | |

FOREIGN PATENT DOCUMENTS

| | | |
|---|---|---|
| EP | 1725079 | 11/2006 |
| EP | 2034538 | 3/2009 |
| EP | 1841834 | 5/2009 |
| EP | 2350216 | 10/2009 |
| JP | 2005-11610 | 1/2005 |
| JP | 2007-123392 | 5/2007 |
| JP | 2007-254297 | 10/2007 |
| JP | 2009-227514 | 10/2009 |
| JP | 2010-135467 | 6/2010 |
| WO | WO 01/39234 | 5/2001 |
| WO | WO 02/02714 | 1/2002 |
| WO | WO 02/15645 | 2/2002 |
| WO | WO 03/040257 | 5/2003 |
| WO | WO 03/060956 | 7/2003 |
| WO | WO 2004/093207 | 10/2004 |
| WO | WO 2004/107822 | 12/2004 |
| WO | WO 2004/111066 | 12/2004 |
| WO | WO 2005/014551 | 2/2005 |
| WO | WO 2005/019373 | 3/2005 |
| WO | WO 2005/030900 | 4/2005 |
| WO | WO 2005/089025 | 9/2005 |
| WO | WO 2005/123873 | 12/2005 |
| WO | WO 2006/009024 | 1/2006 |
| WO | WO 2006/056418 | 6/2006 |
| WO | WO 2006/072002 | 7/2006 |
| WO | WO 2006/082742 | 8/2006 |
| WO | WO 2006/098120 | 9/2006 |
| WO | WO 2006/100298 | 9/2006 |
| WO | WO 2006/103874 | 10/2006 |
| WO | WO 2006/114966 | 11/2006 |
| WO | WO 2006/132173 | 12/2006 |
| WO | WO 2007/002683 | 1/2007 |
| WO | WO 2007/004380 | 1/2007 |
| WO | WO 2007/063754 | 6/2007 |
| WO | WO 2007/063796 | 6/2007 |
| WO | WO 2008/044723 | 4/2008 |
| WO | WO 2008/056746 | 5/2008 |
| WO | WO 2008/057394 | 5/2008 |
| WO | WO 2008/101842 | 8/2008 |
| WO | WO 2008/132085 | 11/2008 |
| WO | WO 2009/000673 | 12/2008 |
| WO | WO 2009/003898 | 1/2009 |
| WO | WO 2009/008311 | 1/2009 |
| WO | WO 2009/018009 | 2/2009 |
| WO | WO 2009/021126 | 2/2009 |
| WO | WO 2009/050290 | 4/2009 |
| WO | WO 2009/062578 | 5/2009 |
| WO | WO 2009/063833 | 5/2009 |
| WO | WO 2009/066778 | 5/2009 |
| WO | WO 2009/066779 | 5/2009 |
| WO | WO 2009/086028 | 7/2009 |
| WO | WO 2009/100991 | 8/2009 |
| WO | WO 2010/011390 | 1/2010 |
| WO | WO 2010/028151 | 3/2010 |
| WO | WO 2010/056066 | 5/2010 |
| WO | WO 2010/068330 | 6/2010 |
| WO | WO 2010/079051 | 7/2010 |
| WO | WO 2010/086089 | 8/2010 |

(56) References Cited

FOREIGN PATENT DOCUMENTS

| WO | WO 2010/107244 | 9/2010 |
|---|---|---|
| WO | WO 2010/111175 | 9/2010 |
| WO | WO 2011/044988 | 4/2011 |
| WO | WO 2011/051404 | 5/2011 |
| WO | WO 2011/075644 | 6/2011 |
| WO | WO 2011/086863 | 7/2011 |

OTHER PUBLICATIONS

Baldo et al., "Very high-efficiency green organic light-emitting devices based on electrophosphorescence," Appl. Phys. Lett., vol. 75, No. 1, 4-6 (1999).
Adachi, Chihaya et al., "Organic Electroluminescent Device Having a Hole Conductor as an Emitting Layer," Appl. Phys. Lett., 55(15):1489-1191 (1989).
Adachi, Chihaya et al., "High-Efficiency Red Electrophosphorescence Devices," Appl. Phys. Lett., 78(11):1622-1624 (2001).
Adachi, Chihaya et al., "Nearly 100% Internal Phosphorescence Efficiency in an Organic Light Emitting Device," J. Appl. Phys., 90(10):5048-5051 (2001).
Aonuma, Masaki et al., "Material Design of Hole Transport Materials Capable of Thick-Film Formation in Organic Light Emitting Diodes," Appl. Phys. Lett., 90:183503-1-183503-3 (2007).
Chang, Chiung-Fang et al, "Highly Efficient Blue-Emitting Iridium(III) Carbene Complexes and Phosphorescent OLEDs," Angew. Chem. Int. Ed. 47, 4542 (2008).
Gao, Zhiqiang et al., "Bright-Blue Electroluminescence From a Silyl-Substituted ter-(phenylene-vinylene)derivative," Appl. Phys. Lett., 74(6):865-867 (1999).
Guo, Tzung-Fang et al., "Highly Efficient Electrophosphorescent Polymer Light-Emitting Devices," Organic Electronics, 1:15-20 (2000).
Hamada, Yuji et al., "High Luminance in Organic Electroluminescent Devices with Bis(10-hydroxybenzo[h]quinolinato)beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High $T_g$ Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of $CHF_3$," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185: Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:1235091-123509-3 (2007).
Kido, Junji et al., 1,2,4-Triazole Derivative as an electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4', 4"-Tri(N-carbazolyl)triphenylamine (TCTA) and 4,4',4"-Tris(3-methylphenylphenyl-amino)triphenylamine (m-MTDATA) as Hole-Transport Materials," Adv. Mater., 6(9):677-679 (1994).
Kwong, Raymond C. et al., "High Operational Stability of Electrophosphorescent Devices," Appl. Phys. Lett., 81(1):162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polmyer Phosphorescent Light-Emitting Devices Doped with Tris(2-phenylpyridine) Iridium as a Triplet Emitters," Appl. Phys. Lett., 77(15):2280-2282 (2000).
Lo, Shih-Chun et al., "Blue Phosphorescence from Iridium(III) Complexes at Room Temperature," Chem. Mater., 18(21):5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Ligth-Emitting Diode: an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorined Phenyl Groups as Ligands," Chem. Lett., 34(4):592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis(dimesitylboryl)-2,2':5', 2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Östergård, T. et al., "Langmuir-Blodgett Light-Emitting Diodes of Poly(3-Hexylthiophene): Electro-Optical Characteristics Related to Structure," Synthetic Metals, 87:171-177 (1997).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91:209-215 (1997).
Shirota, Yasuhiko et al., "Starburst Molecules Based on π-Electron Systems as Materials for Organic Electroluminescent Devices," Journal of Luminescence, 72-74:985-991 (1997).
Sotoyama, Wataru et al., "Efficient Organic LIght-Emitting Diodes with Phosphorescent Platinum Complexes Containing NΛCΛN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
Takizawa, Shin-ya et al., "Phosphorescent Iridium Complexes Based on 2-Phenylimidazo[1,2- α]pyridine Ligands: Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).

(56) References Cited

OTHER PUBLICATIONS

Tung, Yung-Liang et al., "Highly Efficient Red Phosphorescent Osmium(II) Complexes for OLED Applications," *Organometallics* 23, 3745 (2004).

Tung, Yung-Liang et al., "Organic Light-Emitting Diodes Based on Charge-Neutral $Ru^{II}$ Phosphorescent Emitters," *Adv. Mater.*, 17(8):1059-1064 (2005).

Van Slyke, S. A. et al., "Organic Electroluminescent Devices with Improved Stability," *Appl. Phys. Lett.*, 69(15): 2160-2162 (1996).

Wang, Y. et al., "Highly Efficient Electroluminescent Materials Based on Fluorinated Organometallic Iridium Compounds," *Appl. Phys. Lett.*, 79(4):449-451 (2001).

Wong, Keith Man-Chung et al., A Novel Class of Phosphorescent Gold(III) Alkynyl-Based Organic Light-Emitting Devices with Tunable Colour, *Chem. Commun.*, 2906-2908 (2005).

Wong, Wai-Yeung et al., "Multifunctional Iridium Complexes Based on Carbazole Modules as Highly Efficient Electrophosphors," *Angew. Chem. Int. Ed.*, 45:7800-7803 (2006).

\* cited by examiner

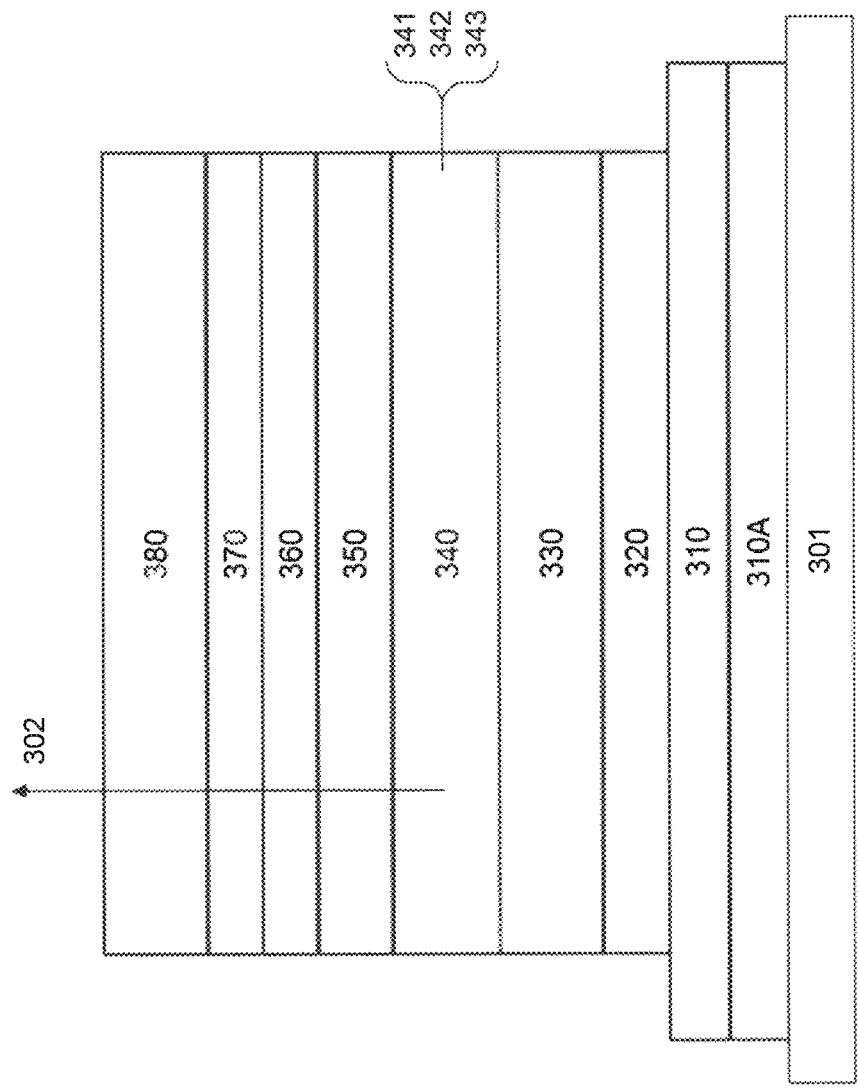

ORGANIC ELECTROLUMINESCENT MATERIALS AND DEVICES

The claimed invention was made by, on behalf of, and/or in connection with one or more of the following parties to a joint university corporation research agreement: Regents of the University of Michigan, Princeton University. The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) structures with multiple dopants and suppression mechanisms.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

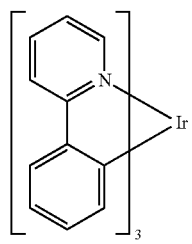

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built, on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means farthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In one embodiment a device comprising an anode, a cathode, and an organic emissive layer disposed between the anode and cathode is disclosed. The organic emissive layer comprises a host, a first compound, and a second compound all mixed in the emissive layer. The first compound is capable of phosphorescent emission at room temperature and is present in an amount less than 3 weight %. It has a global maximum in its visible emission spectrum at a first wavelength. The second compound is capable of phosphorescent emission at room temperature and has a global maximum in its visible spectrum at a second wavelength. The first wavelength is longer than the second wavelength and the difference between the first wavelength and the second wavelength is between 0 nm and 80 nm. The device includes a suppression mechanism that is capable of preferentially reducing emission of light emitted by the second compound.

In one embodiment, the suppression mechanism is selected from the group consisting of a micro-cavity, down-conversion filter, and an optical filter.

In one embodiment, the intensity of light emitted by the device at the second wavelength divided by the intensity of light emitted by the device at the first wavelength is less than 0.01.

In one embodiment, the difference between the first wavelength and the second wavelength is between 20 nm and 80 nm. In one embodiment, the difference is between 40 nm and 80 nm.

In one embodiment, the first compound is capable of red phosphorescent emission and the first wavelength is in the range 590-700 nm.

In one embodiment, the second wavelength is in the range 510-590 nm. In one embodiment, the device emits light having a 1931 CIE coordinate of [0.66±0.04, 0.34±0.04]. In one embodiment, the device emits light having a 1931 CIE coordinate of [0.66±0.02, 0.34±0.02].

In one embodiment, the first compound is capable of yellow phosphorescent emission, and the first wavelength is in the range 560-590 nm. In one embodiment, the second wavelength is in the range 480-560 nm. In one embodiment, the device emits light having a 1931 CIE coordinate of [0.44±0.04, 0.55±0.04]. In one embodiment, the device emits light having a 1931 CIE coordinate of [0.44±0.02, 0.55±0.02].

In one embodiment, the first compound is capable of green phosphorescent emission and the first wavelength is in the range 500-560 nm. In one embodiment, the second wavelength is in the range 420-500 nm. In one embodiment, the device emits light having a 1931 CIE coordinate of [0.25±0.15, 0.65±0.15]. In one embodiment, the device emits light having a 1931 CIE coordinate of [0.25±0.10, 0.65±0.10].

In one embodiment, the first compound is present in an amount less than 2.5 weight %. In one embodiment, the first compound is present in an amount less than 2 weight %. In one embodiment, the first compound is present in an amount less than 1 weight %.

In one embodiment, the device is a top-emitting OLED. In one embodiment, the device is a bottom-emitting OLED.

In one embodiment, the second compound is present in an amount between 3% to 30% weight.

In one embodiment, the first compound has the formula of $Ir(L^1)_2(L^2)$. $L^1$ is selected from the group consisting of:

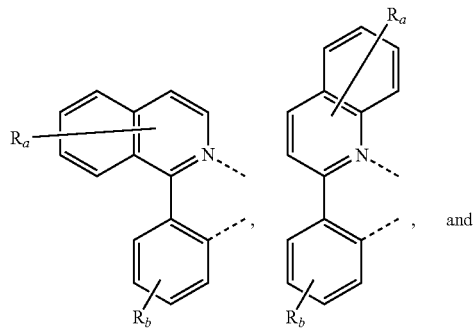

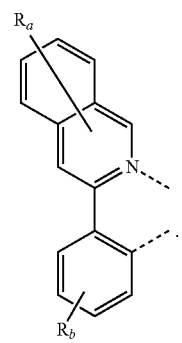

$L^2$ is

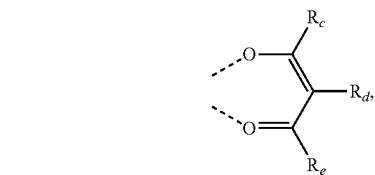

$R_a$ and $R_b$ represent mono, di, tri, or tetra substitution, or no substitution. $R_a$, $R_b$, $R_c$, $R_d$, and $R_e$ are independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof. Two adjacent substituents of $R_a$, and $R_b$ are optionally joined to form a fused ring or form a multidentate ligand.

In one embodiment, the second compound has the formula of $Ir(L^3)_2(L^4)$. $L^3$ has the formula:

$L^4$ has the formula:

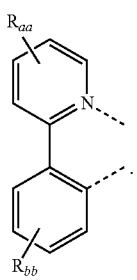

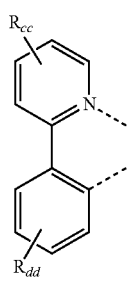

and is different from $L^3$, $R_{aa}$, $R_{bb}$, $R_{cc}$, and $R_{dd}$ represent mono, di, tri, or tetra substitution, or no substitution. $R_{aa}$, $R_{bb}$, $R_{cc}$, and $R_{dd}$ are independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof. Two adjacent substituents of $R_{aa}$, $R_{bb}$, $R_{cc}$, and $R_{dd}$ are optionally joined to form a fused ring or form a multidentate ligand.

In one embodiment, the first compound and the second compound each independently have the formula of $Ir(L^3)_2(L^4)$. $L^3$ has the formula:

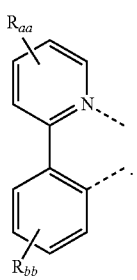

$L^4$ has the formula:

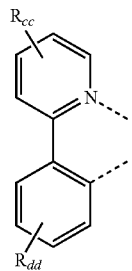

and is different from $L^3$. $R_{aa}$, $R_{bb}$, $R_{cc}$, and $R_{dd}$ represent mono, di, tri, or tetra substitution, or no substitution. $R_{aa}$, $R_{bb}$, $R_{cc}$, and $R_{dd}$ are independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof. Two adjacent substituents of $R_{aa}$, $R_{bb}$, $R_{cc}$, and $R_{dd}$ are optionally joined to form a fused ring or form a multidentate ligand. In first compound at least one of $R_{cc}$ is a 5 or 6-membered aromatic carbocyclic or heterocyclic ring.

In one embodiment, the first compound has the formula of $Ir(L^3)_2(L^4)$. $L^3$ has the formula:

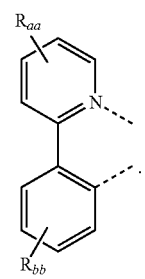

$L^4$ has the formula:

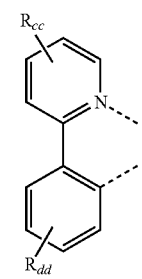

and is different from $L^3$.

$R_{aa}$, $R_{bb}$, $R_{cc}$, and $R_{dd}$ represent mono, di, tri, or tetra substitution, or no substitution. $R_{aa}$, $R_{bb}$, $R_{cc}$, and $R_{dd}$ are independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfanyl, sulfonyl, phosphino, and combinations thereof. Two adjacent substituents of $R_{aa}$, $R_{bb}$, $R_{cc}$, and $R_{dd}$ are optionally joined to form a fused ring or form a multidentate ligand. The second compound has the formula of $Ir(L^5)_2(L^6)$ or $Ir(L^5)_3$. $L^5$ and $L^6$ are each independently selected from the group consisting of:

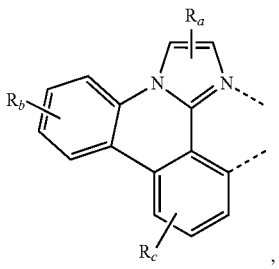

,

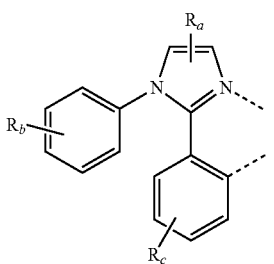

,

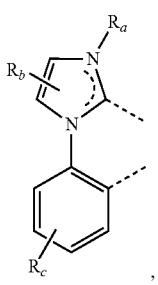

,

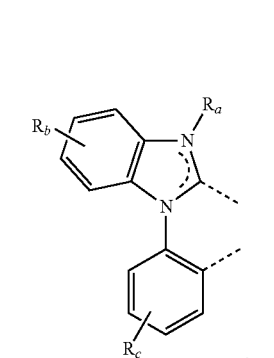

,

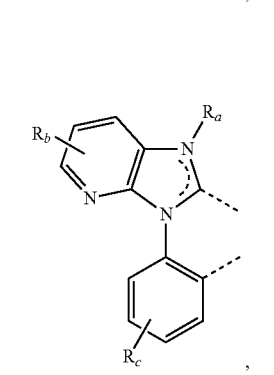

,

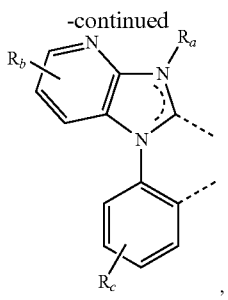

,

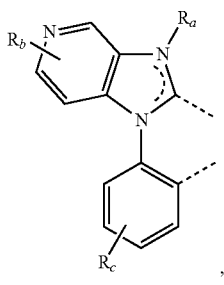

,

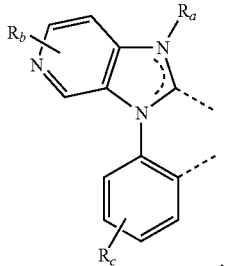

,

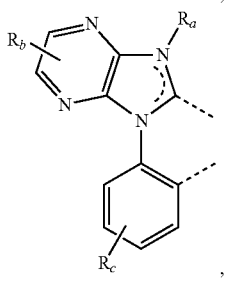

,

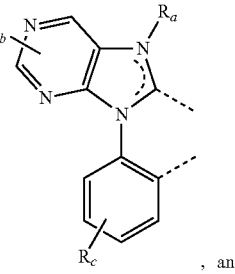

, and

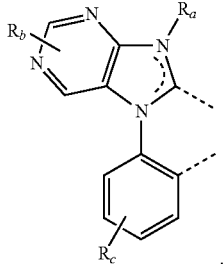

.

$R_a$ represents mono, or di, substitution, or no substitution.
$R_b$, and $R_c$ may represent mono, di, tri, or tetra substitution, or no substitution. $R_a$, $R_b$, and $R_c$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof. Two adjacent substituents of $R_a$, $R_b$, and $R_c$ are optionally joined to form a fused ring or form a multidentate ligand.

In one embodiment, the host comprises at least one chemical group selected from the group consisting of triphenylene, carbazole, dibenzothiphene, dibenzofuran, dibenzoselenophene, aza-triphenylene, aza-carbazole, aza-dibenzothiophene, aza-dibenzofuran, and aza-dibenzoselenophene.

In one embodiment, the emissive layer further comprises a third compound capable of phosphorescent emission at room temperature. The third compound has a global maximum in its visible emission spectrum at a third wavelength, the first wavelength longer than the third wavelength. The suppression mechanism is capable of preferentially reducing emission of light emitted by the third compound.

In one embodiment, the emissive layer does not include any compound capable of phosphorescent emission at room temperature other than the first and second compounds.

In one embodiment, a device includes an anode, a cathode, and an organic light emission layer disposed between the anode and the cathode. The organic light emission layer includes a host, a first compound capable of phosphorescent emission at room temperature, a second compound capable of phosphorescent emission at room temperature, and a third compound capable of phosphorescent emission at room temperature. The first compound, second compound, third compound, and host are mixed in the emissive layer. The first compound has a global maximum in its visible emission spectrum at a first wavelength and the second compound has a global maximum in its visible emission spectrum at a second wavelength. The first wavelength is longer than the second wavelength. The third compound has a global maximum in its visible emission spectrum at a third wavelength. The second wavelength is longer than the third wavelength. The device includes a suppression mechanism capable of preferentially reducing emission of light emitted by the second compound and the third compound.

In one embodiment, the device emits light having a 1931 CIE coordinate of [0.66±0.04, 0.34±0.04]. In one embodiment, the device emits light having a 1931 CIE coordinate of [0.66±0.02, 0.34±0.02].

In one embodiment, the first compound is capable of red phosphorescent emission, and the first wavelength is in the range 590-700 nm. In one embodiment, the first compound is present in an amount between 1% and 5% weight.

In one embodiment, the second compound is capable of yellow phosphorescent emission, and the second wavelength is in the range 560-590 nm. In one embodiment, the second compound is present in an amount between 3 and 30% weight. In one embodiment, the second compound is present in an amount between 6% and 24% weight.

In one embodiment, the third compound is capable of green phosphorescent emission, and the third wavelength is in the range 500-560 nm. In one embodiment, the second compound is present in an amount between 3 and 30% weight. In one embodiment, the third compound is present in an amount between 6% and 24% weight.

In one embodiment, a device includes an anode, a cathode, and an organic light emission layer disposed between the anode and the cathode. The organic light emission layer includes a host, a first compound capable of phosphorescent emission at room temperature, and a second compound capable of phosphorescent emission at room temperature. The first compound, the second compound and the host are mixed in the emissive layer. The first compound has a global maximum in its visible emission spectrum at a first wavelength and the second compound has a global maximum in its visible emission spectrum at a second wavelength. The first wavelength is longer than the second wavelength. The device includes a suppression mechanism capable of preferentially reducing emission of light emitted by the second compound. The difference between the first wavelength and the second wavelength is between 40 and 80 nm.

In one embodiment, the suppression mechanism is a micro-cavity.

In one embodiment, the device is a top-emitting OLED.

BRIEF DESCRIPTION OF THE DRAWINGS

FIG. 3 shows a top-emitting OLED with two dopants.

DETAILED DESCRIPTION

Generally, an OILED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an excipiex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
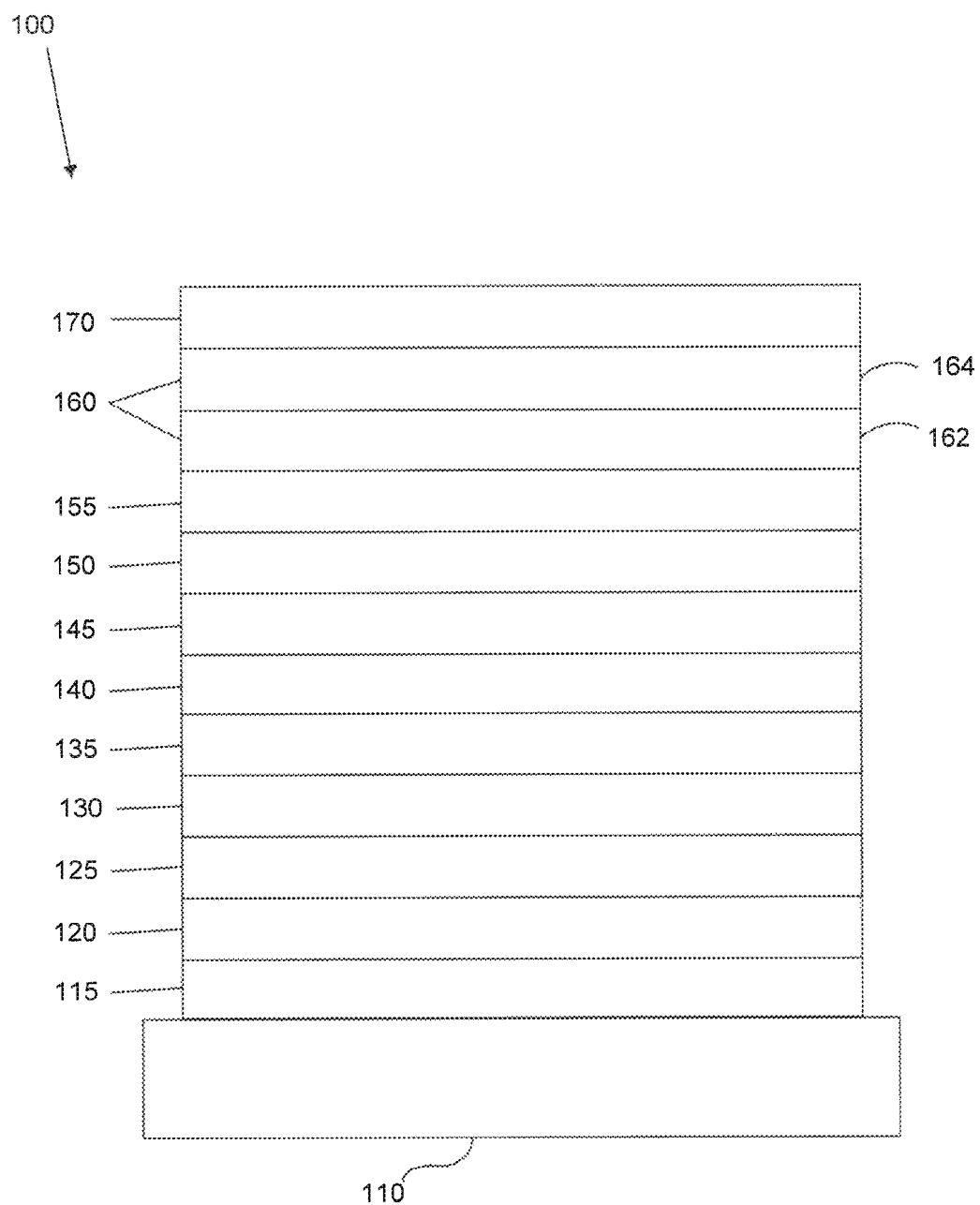
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples fir each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980. Which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes inc hiding compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
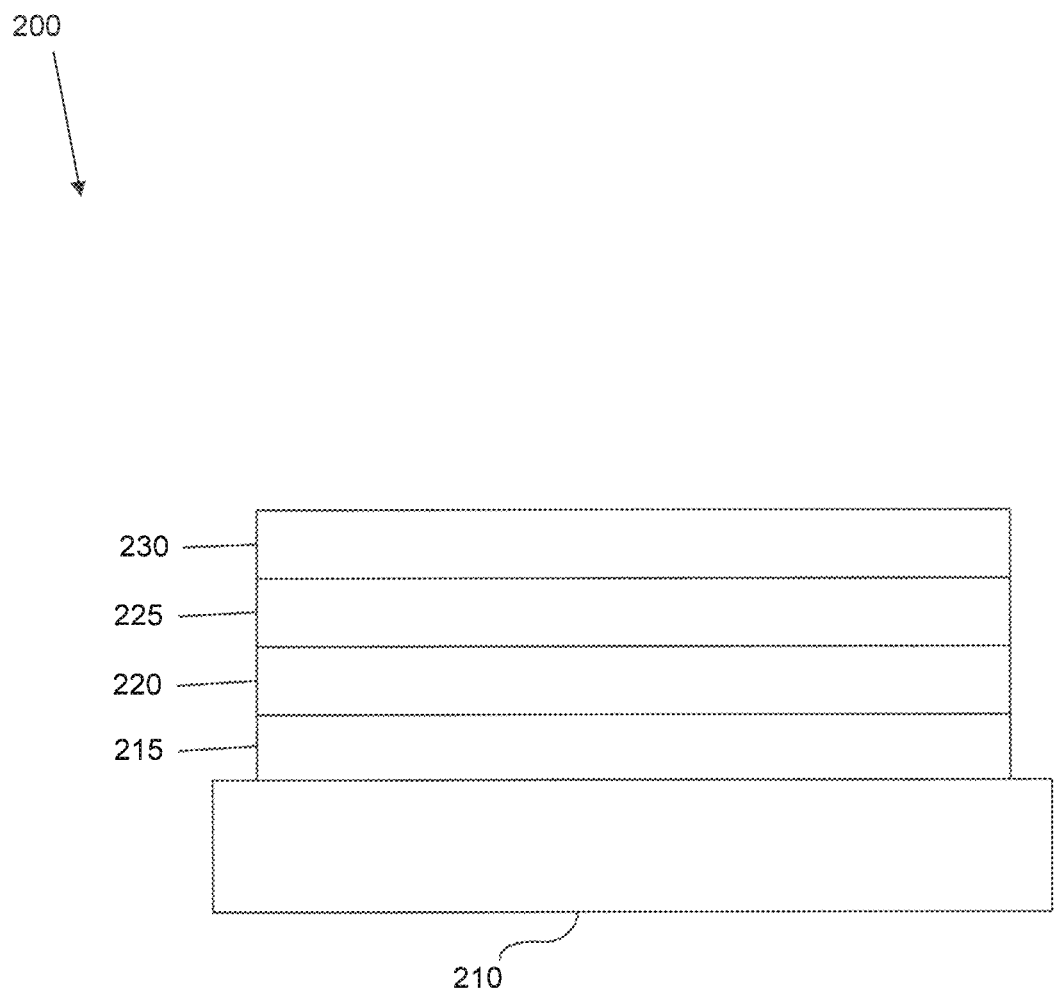
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as inkjet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo" or "halogen" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also refer to heteroaryl. Preferred hetero-non-aromatic cyclic groups are those containing 3 to 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Additionally, the aryl group may be optionally substituted.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzonethiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. naphthyl, dibenzofuryl) or as if it were the whole molecule (e.g. naphthalene, dibenzofuran). As used herein, these different ways of designating a substituent or attached fragment are considered to be equivalent.

In an OLED, the characteristic of the color seen by the user depends on many factors in OLED design. This includes but is not limited to: the types of compounds used in the organic emissive layer, the concentration of the compounds, and, if more than one compound is used in the emissive layer, the compounds' interactions with each other. An OLED with a multi dopant emissive layer may be designed such that the user only sees one color. This can occur where one compound (or dopant) is capable of emitting a certain color, but in operation, contributes less than 5% of the light emitted by OLED. The remainder of light emitted by the OLED is emitted by the other dopants in the emissive layer. While this type of device may achieve desirable color output, often times, however, these devices are limited in their efficiency and color range.

Embodiments disclosed herein generally relate to OLEDs containing more than one compound in the emissive layer that are capable of phosphorescence emission. The amount of the compounds present in the emissive layer, the characteristics of those compounds, and their relationship to each other result in overall enhanced OLED performance and relative lifetime. Additionally, embodiments disclosed herein are capable of achieving a wide range of color emission.

OLED 300 as shown in FIG. 3 is an exemplary device. In some embodiments, OLED 300 includes a substrate 301, an anode 310, cathode 370, and an organic emissive layer 340 between the cathode and the anode. OLED 300 may also optionally have a reflective anode 310A, hole insertion layer (HIL) 320, a hole transporting layer (HTL) 330, an electron transporting layer (ETL) 350, an electron insertion layer (EIL) 360, and a capping layer 380 as shown in FIG. 3. Additionally, OLED 300 can have other layers or sub-layers not shown, such as hole blocking layers and electron blocking layers as described elsewhere in this work.

In some embodiments, organic emissive layer 340 may be comprised of three components: a host 341, a first compound 342, and a second compound 343. This is shown in FIG. 3. As used herein "a host" may include one or more than one host compounds. These three components may be mixed in the organic emissive layer 340. The first compound 342 is capable of phosphorescent emission at room temperature and is present in the emissive layer in an amount less than 3 weight %. In some embodiments, the first compound may be present in an amount less than 2.5 weight %, less than 2 weight %, or less than 1 weight %. The first compound has a global maximum in its visible emission spectrum. This global maximum occurs at a first wavelength. As used herein, a "global maximum" refers to the absolute maximum in a compound's emission spectrum. The second compound is also capable of phosphorescent emission at room temperature. In some embodiments, the second compound is present in the organic emissive layer in an amount between 3 and 30 weight %, preferably between 6 and 24 weight %. The second compound has a global maximum in its visible emission spectrum at a second wavelength. The first wavelength is longer than the second wavelength. The difference between the first wavelength and the second wavelength is between 0 nm and 80 nm, preferably between 20 nm and 80 nm, and more preferably between 40 nm and 80 nm.

In one embodiment, the intensity of light emitted by the device at the second wavelength divided by the intensity of light emitted by the device at the first wavelength is less than 3%, preferably less than 1%, more preferably less than 0.5%, and most preferably less than 0.1%. The intensity of light emitted by the device at the second wavelength divided by the intensity of light emitted by the device at the first wavelength may be referred to as the "intensity ratio" of the device. The intensity ratio is a measure of whether the device includes undesirable emission from the second compound.

In one embodiment, the host has highest triplet energy T1 in the organic emissive layer. One method of determining triplet energy is by using the highest phosphorescent energy peak in an organic solvent glass at 77° K. Unless otherwise specified, triplet energy levels described in this application are determined as described in this paragraph.

Many compounds may be used for the first and second compounds as long as other criteria discussed are met. In some embodiments, the first compound may have the formula $Ir(L^1)_2(L^2)$. $L^1$ may be selected from:

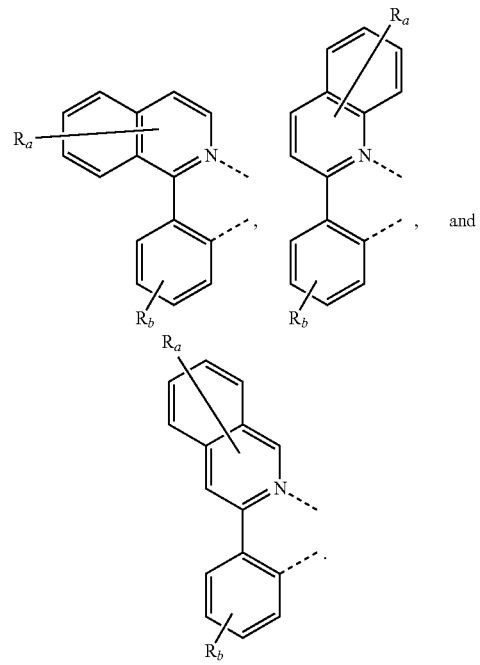

$L^2$ may have the formula:

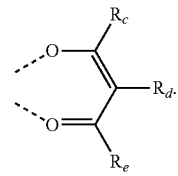

$R_a$ and $R_b$ may represent mono, di, tri, or tetra substitution, or no substitution. $R_a$, $R_b$, $R_c$, $R_d$, and $R_e$ may be independently selected from a group including but not limited to hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, or combinations thereof. Additionally, two adjacent substituents of $R_a$ and $R_b$ are optionally joined to form a fused ring or form a multidentate ligand. As used herein, "joined" means that the two adjacent substituents are linked together by a chemical bond.

In some embodiments, the second compound may have the formula $Ir(L^3)_2(L^4)$.

$L^3$ may have the formula:

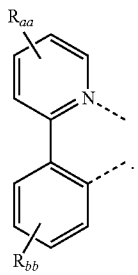

$L^4$ may be different from $L^3$ and may have the formula:

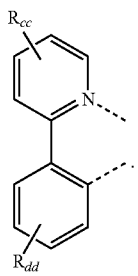

$R_{aa}$, $R_{bb}$, $R_{cc}$, and $R_{dd}$ may represent mono, di, tri, or tetra substitution, or no substitution. $R_{aa}$, $R_{bb}$, $R_{cc}$, and $R_{dd}$ are independently selected from a group including but not limited to hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof. Two adjacent substituents of $R_{aa}$, $R_{bb}$, $R_{cc}$, and $R_{dd}$ may be optionally joined to form a fused ring or form a multidentate ligand. Preferably, at least one of $R_{cc}$ is a 5 or 6-membered aromatic carbocyclic or heterocyclic ring. However, embodiments where $R_{ce}$ is not an aromatic ring is also envisioned.

In some embodiments, the first compound and the second compound may each independently have the formula of $Ir(L^3)_2(L^4)$ as discussed above.

In some embodiments, the first compound may have the formula of $Ir(L^3)_2(L^4)$ as discussed above and the second compound may have the formula of $Ir(L^5)_2(L^6)$ or $Ir(L^5)_3$. $L^5$ and $L^6$ are each independently selected from the group including:

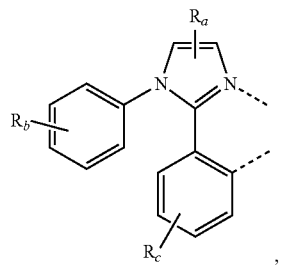

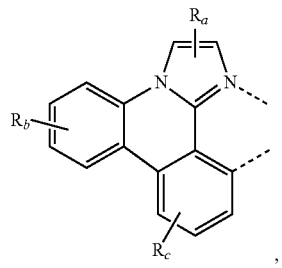

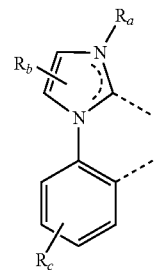

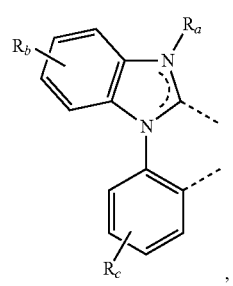

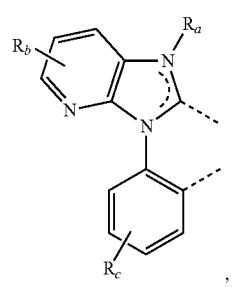

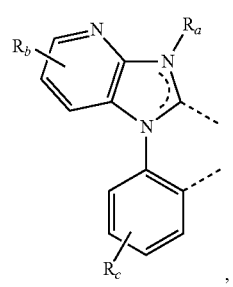

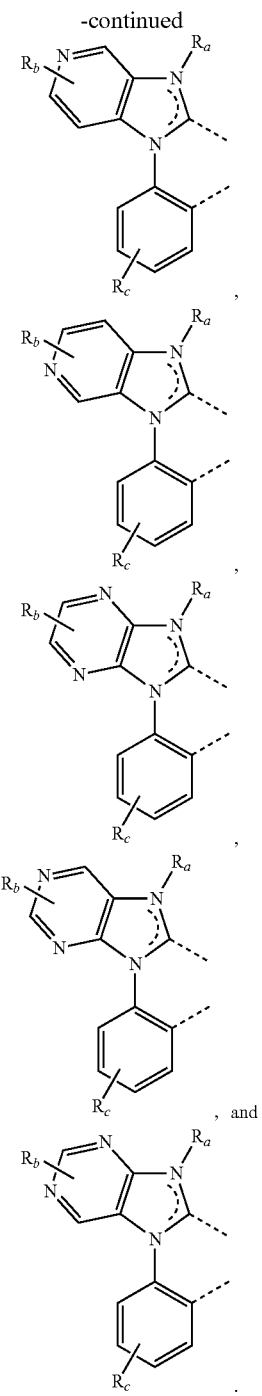

$R_a$ may represent mono, or di, substitution, or no substitution. $R_b$, and may represent mono, di, tri, or tetra substitution, or no substitution. $R_a$, $R_b$, and $R_c$ are independently selected from the group including but not limited to hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof. Two adjacent substituents of $R_a$, $R_b$, and $R_c$ are optionally joined to form a fused ring or form a multidentate ligand.

OLED 300 also includes a suppression mechanism that is capable of preferentially reducing the emission of light emitted by the second compound. As used herein, "preferentially" is relative to the first compound. In other words, as compared to the first compound, the suppression mechanism attenuates the emission spectra of the second compound more than the emission spectra of the first compound. The suppression mechanism also preferably has minimal attenuation at the global maximum of the first compound. Thus, the suppression mechanism affects the characteristic of the light 302 that is emitted from the organic emissive layer.

Figure 3A:
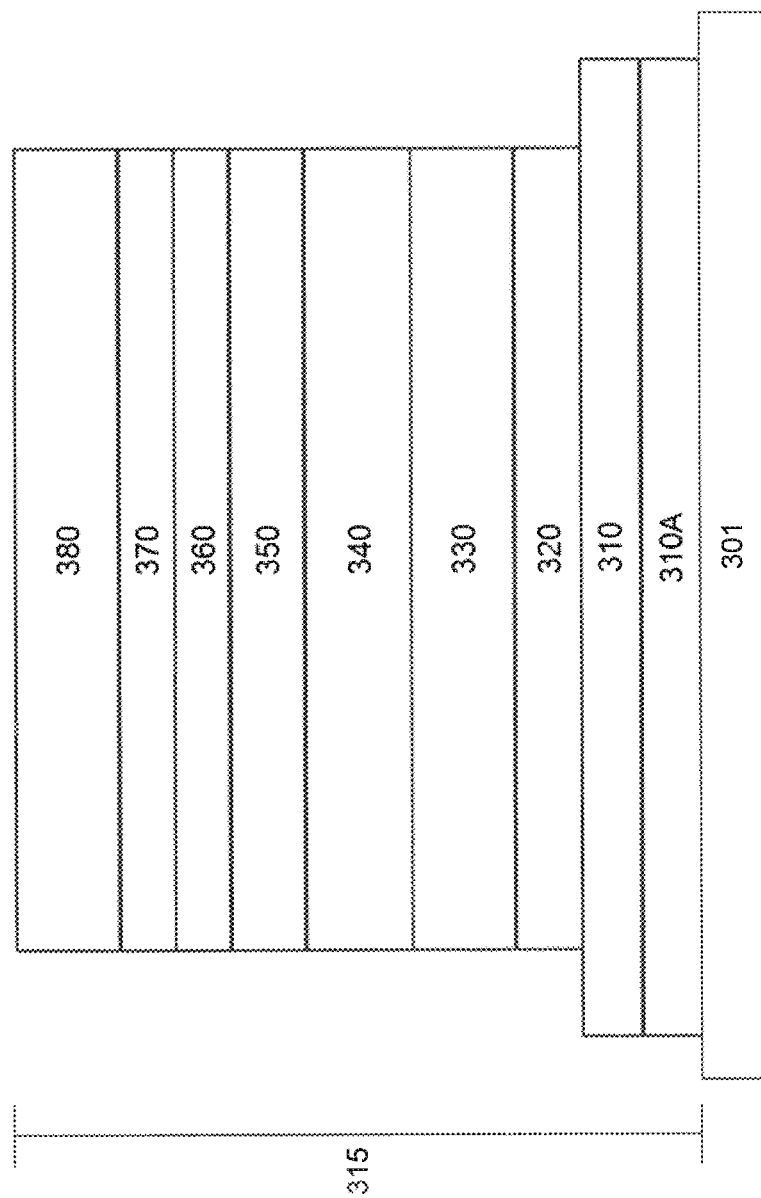
FIG. 3A shows an OLED with a micro-cavity.

One type of suppression mechanism that may be used is a micro-cavity 315. This is shown in FIG. 3A. OLEDs may be constructed such that electrodes or other reflective or semi-reflective layers of the device define a micro-cavity. When the optical distance between two reflective or semi-reflective layers has a magnitude that is comparable to a wavelength of visible light, micro-cavity effects may result. The transmission of the separated layers may then exceed the transmission of the individual reflective or semi-reflective layers at one or more wavelengths or wavelength ranges. For example, a device may quench, prevent, or otherwise diminish emission at some wavelengths, and/or increase emission at certain wavelengths at which the device emits. While these and similar effects may be referred to as "micro-cavity effects," these devices are not necessarily considered to contain or define a "micro-cavity" as used herein. Such incidental micro-cavity effects typically are unintentional and undesirable.

A micro-cavity may be characterized by its finesse. The finesse F of a micro-cavity is defined as the ratio of the separation between resonant peaks in the transmission spectrum of the micro-cavity, $\Delta \upsilon$, to the full-width at half-maximum (FWHM) of the resonant frequency peak of the spectrum, $\Delta \upsilon_{1/2}$: $F = \Delta \upsilon / \Delta \upsilon_{1/2}$. As used herein, a "micro-cavity" or "cavity" is a stack of two or more layers having a finesse greater than about 1.5; the two outer layers of a micro-cavity may be referred to as "defining" a micro-cavity when the resulting micro-cavity has a finesse of at least about 1.5. Such a finesse corresponds to micro-cavity effects that are stronger than the incidental effects typically observed in, for example, an OLED. Incidental micro-cavity effects in an OLED generally have a finesse of less than 1.5, often less than 0.5. The resonant peaks in the transmission spectrum of a micro-cavity can be controlled by adjusting the reflectivity of the layers defining the micro-cavity and the separation between the layers. In general, micro-cavities may be constructed that have one transparent or semitransparent reflective layer and one opaque reflective layer. It may be preferred for reflective layers used in the micro-cavity devices described herein to have a reflectance of at least 20%, and more preferably 30-100%. In some cases, the "opaque" reflective layer may be opaque only with respect to certain wavelengths of visible light, while allowing other wavelengths to pass through the layer. In such a configuration, it may be preferred for the reflective layer to be at least 20% reflective, and more preferably 30-100% reflective, with respect to the desired wavelengths. The emission in the forward direction (i.e., through the transparent or semitransparent reflective layer) may be calculated as:

$$|E_c(\lambda)|^2 = \frac{(1-R_d)\left[1+R_m+2\sqrt{R_m}\cos\left(\frac{4\pi x}{\lambda}\right)\right]}{1+\sqrt{R_m R_d}\cos\left(\frac{4\pi L}{\lambda}\right)}|E_n(\lambda)|^2 \quad \text{(Eq. 1)}$$

where λ is the emission wavelength, x is the effective distance of the emissive layer from the opaque layer, $R_m$, and $R_d$ are the reflectivities of the opaque mirror and the transparent mirror, respectively, L is the total optical length of the micro-cavity, and $E_n(\lambda)$ is an original (free-space) spectrum. The optical length of the micro-cavity, L, may be given by:

$$L = \frac{\lambda}{2}\left(\frac{n_{eff}}{\Delta n}\right) + \sum_i n_i d_i + \left|\frac{\varphi_m}{4\pi}\lambda\right| \quad \text{(Eq. 2)}$$

where $n_{eff}$ and Δn are the effective refractive index and the index difference between the reflective layers, $n_i$ and $d_i$ are the refractive index and the thickness of the organic layers and the transparent layer, and $\phi_m$ is the phase change at the opaque mirror. Thus, a micro-cavity may be used to enhance emission at certain wavelength, wavelengths, or range of wavelengths, while inhibiting emission at others. As used herein, the micro-cavity may be said to "leak" those wavelengths of light which are quenched, left unchanged, and/or only minimally enhanced by the micro-cavity.

Figure 3B:
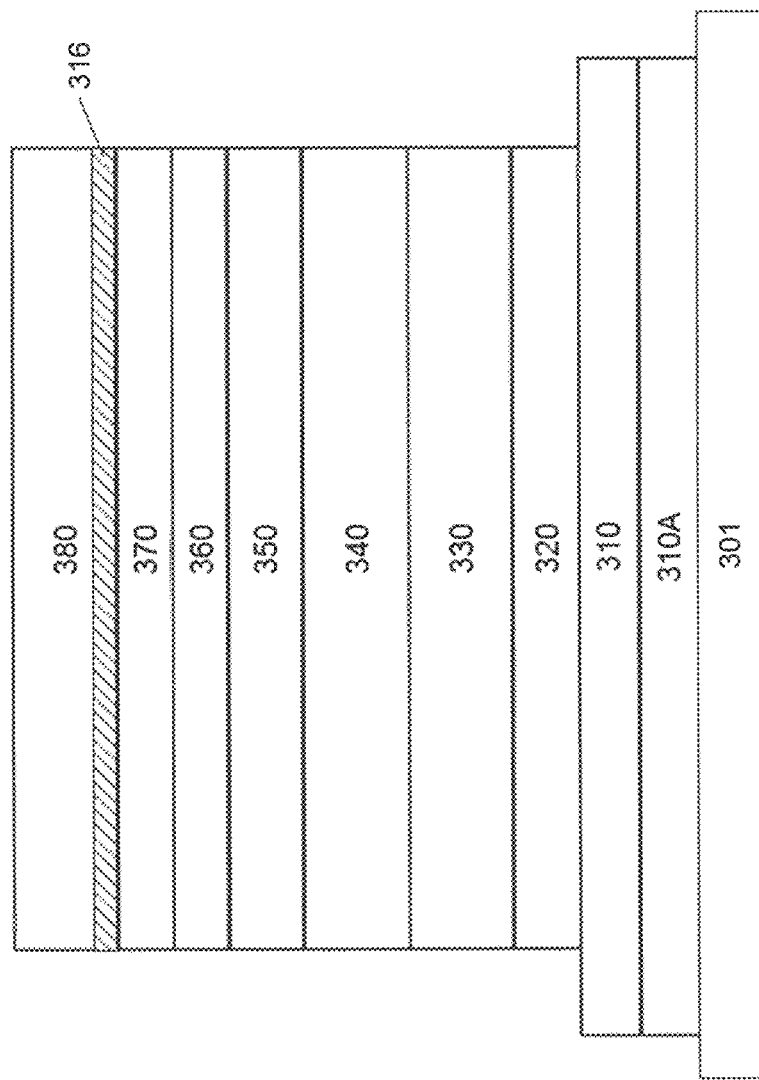
FIG. 3B shows an OLED with a down conversion filter.
Figure 3C:
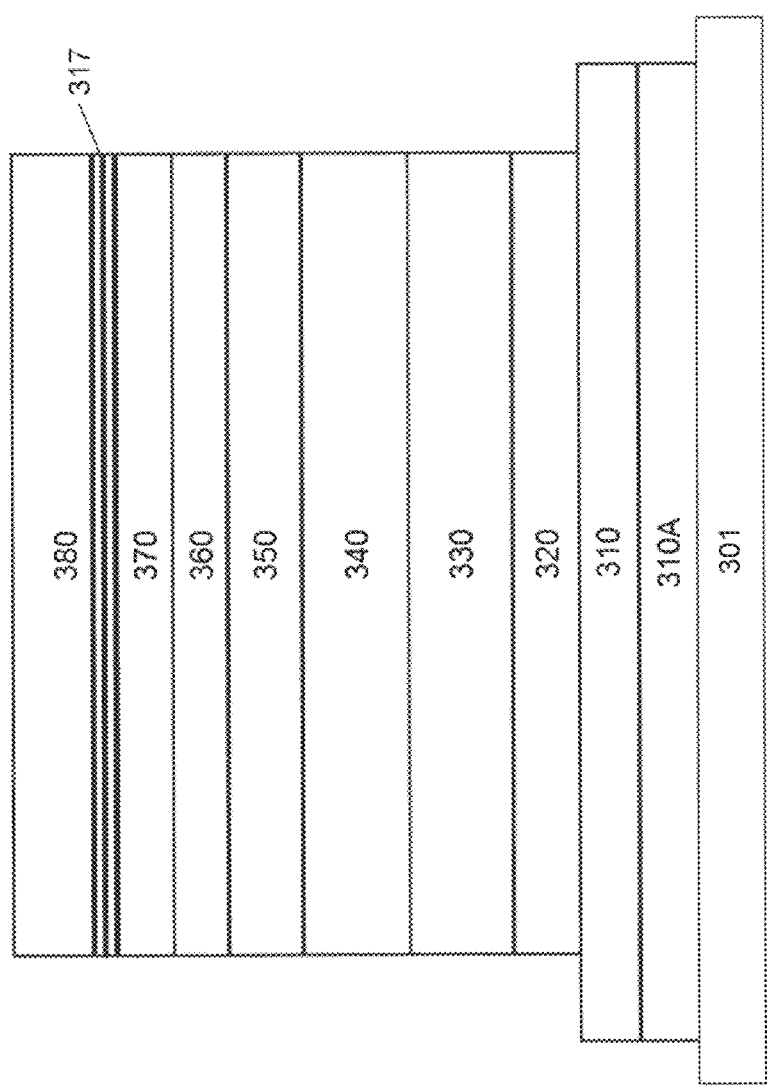
FIG. 3C shows an OLED with an optical filter.

Many other types of suppression mechanisms capable of preferentially reducing light emission may also be used, including but not limited to conversion filters, optical filters, such as absorptive filters, dichroic filters, band-pass filters, and dielectric stacks, and other mechanisms known in the art. These are shown in FIG. 3B-C. As used herein, a "suppression mechanism" does not include a high doping concentration of the second compound relative to the first compound.

OLED 300 may be designed such that its light output generally corresponds to certain "color" in the visible spectrum, such as red or green color. As used herein, the visible spectrum includes wavelengths in the range of 400 nm to 700 nm. As used herein, "red" light corresponds to an emission spectrum with a peak wavelength in the range of 590 nm to 700 nm. "Yellow" light corresponds to an emission spectrum with a peak wavelength in the range of 550 nm to 590 nm. "Green" light corresponds to an emission spectrum with a peak wavelength in the range of 500 nm to 550 nm. "Blue" light corresponds to an emission spectrum with a peak wavelength in the range of 400 nm to 500 nm.

One way to characterize the light output of an OLED is with CIE coordinates. CIE coordinates can be characterized according to a 1931 or a 1976 standard. Any given coordinate can be converted back and forth between the two standards.

In some embodiments, OLED 300 has an overall red light output. In these embodiments, the OLED 300 emits light having a 1931 CIE coordinate of [0.66±0.04, 0.34±0.04], preferably of [0.66±0.02, 0.34±0.02]. The first compound 342 is capable of red phosphorescent emission, with a global maximum in the range of 590 DM to 700 nm. The second compound has a global maximum in the wavelength range of 510 nm to 590 nm.

In some embodiments, OLED 300 has an overall yellow light output. In these embodiments, OLED 300 emits light having a 1931 CIE coordinate of [0.44±0.04, 0.55±0.04], preferably of [0.44±0.02, 0.55±0.02]. The first compound is capable of yellow phosphorescent emission with a global maximum in the range of 560 nm to 590 nm. The second compound has a global maximum in the range of 480 nm to 560 nm.

In some embodiments, OLED 300 has an overall green light output. In these embodiments, OLED 300 emits light having a 1931 CIE coordinate of [0.25±0.15, 0.65±0.15], preferably of [0.25±0.10, 0.65±0.10]. The first compound is capable of green phosphorescent emission with a global maximum in the range of 500 nm to 560 nm. The second compound has a global maximum in the range of 420 nm to 500 nm.

Figure 4:
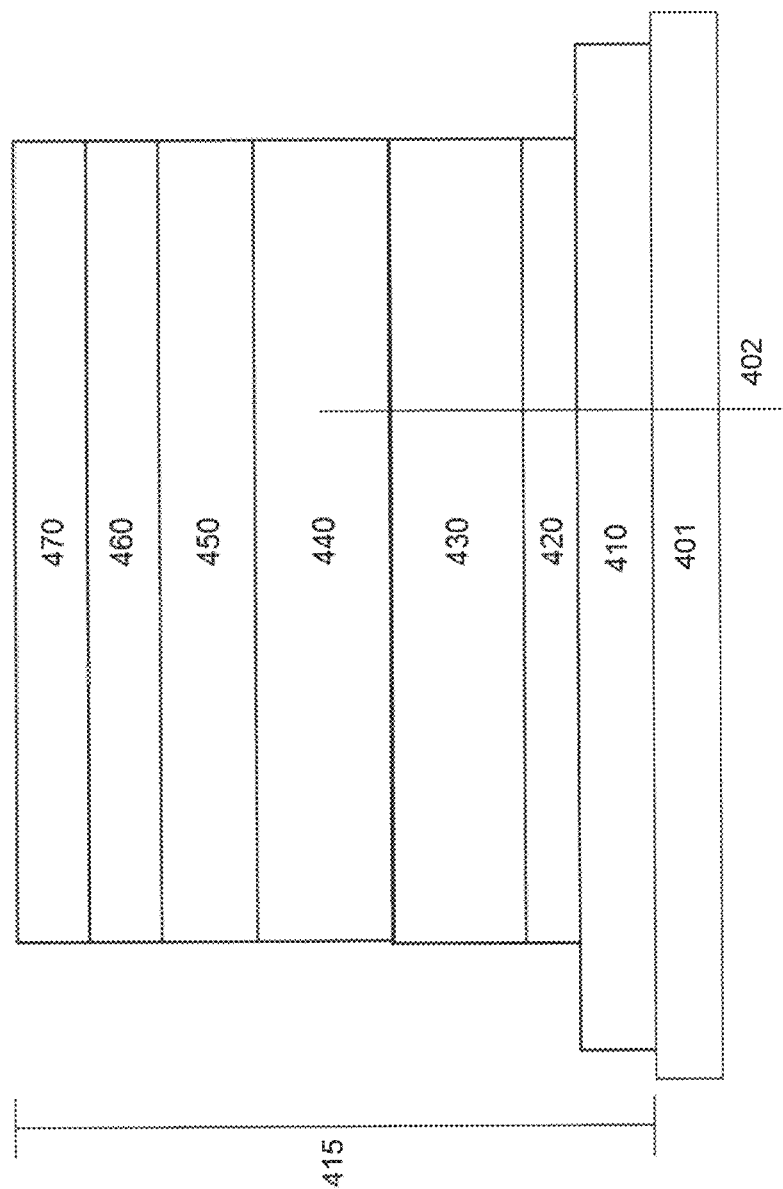
FIG. 4 shows a bottom-emitting OLED.

OLED 300 as depicted in FIG. 3 is a top-emitting OLED. In a top-emitting OLED, light is transmitted in the direction of arrow 302 to the end user. Additionally, in a top-emitting OLED, the substrate and other layers at the bottom of the OLED may be reflective. In some embodiments, OLED 300 may be a bottom-emitting OLED. FIG. 4 depicts a bottom-emitting OLED 400. OLED 400 is similar to OLED 300 in every way except that it does not contain reflective anode 310A and it has a transparent substrate 401. Additionally, light is emitted in direction of 402 in device 400. Bottom-emitting OLEDs may contain reflective layers, but these layers are usually closer to the top of the OLED.

In some embodiments, OLEDs 300 and 400 do not include any other compounds capable of phosphorescent emission at room temperature other than the first and second compounds. In some embodiments, however, OLEDs 300 and 400 may include a third compound in the organic emissive layer that is capable of phosphorescent emission at room temperature. In this embodiment, the suppression mechanism is capable of preferentially reducing the emission of light emitted by this third compound in addition to the light emitted by the second compound. This third compound has a global maximum in its visible spectrum at a third wavelength shorter than the first wavelength (the wavelength at which there is a global maximum of the first compound). This third wavelength may be at any wavelength meeting this criteria, but in one embodiment, the third wavelength is between 500 nm to 560 nm and is capable of green phosphorescent emission. While only three compounds capable of phosphorescent emission are described, one of ordinary skill in the art, with the benefit of this disclosure, can readily add additional compounds capable of phosphorescent emission.

Figure 5:
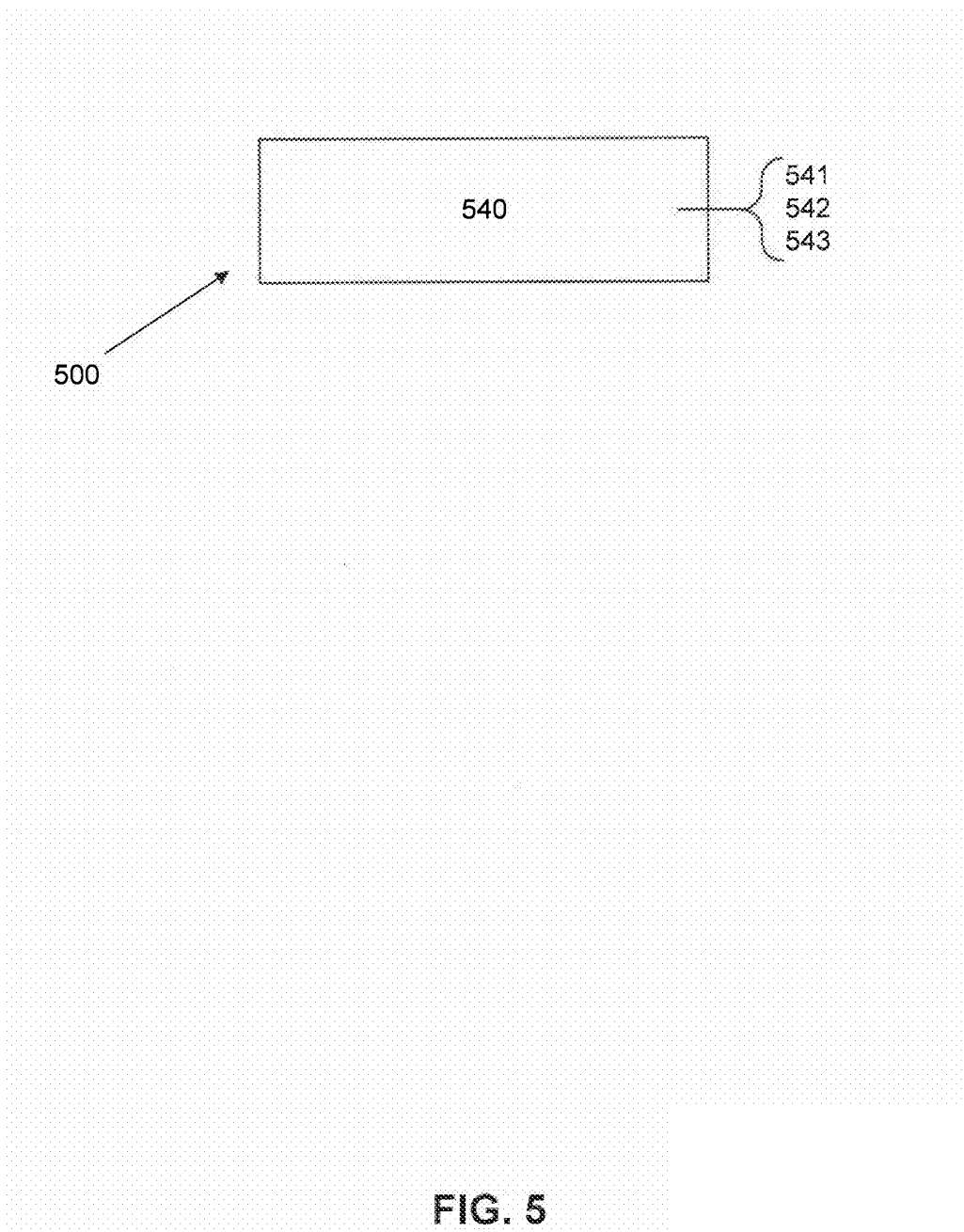
FIG. 5 shows the organic emissive layer of an OLED with two dopants.

FIG. 5 shows the organic emissive layer 540 of another exemplary device 500 according to one embodiment. Device 500 is similar to device 300, except for differences discussed below.

Device 500, like device 300, may include a host 541, a first compound 542 and a second compound 543 in its organic emissive layer. The host, first compound, and second compound may be mixed in the emissive layer. The first and second compounds are capable of phosphorescent emission at room temperature. The first compound 542 has a global maximum in its visible emission spectrum at a first wavelength and the second compound 543 has a global maximum in its visible emission spectrum at a second wavelength. The first wavelength is longer than the second wavelength. In device 500, unlike in device 300, however, the first compound may be present in any weight %, including amounts greater than 3 weight %. Preferably, the first compound is present in amounts from 1 to 5 weight %.

In embodiments where the weight % of the first compound is relaxed and is not limited to amounts smaller than 3 weight %, the ranges that the first wavelength and the second wavelength fall in may help enhance device performance. In device 500, the first and second wavelengths are within a specified range of each other. This range can be between 40 and 80 nm, and more preferably between 50 nm and 80 nm.

Additionally, a suppression mechanism may also enhance device performance. Device 500 has a suppression mechanism that is similar to suppression mechanism described in device 300. This suppression mechanism is capable of preferentially reducing emission of light emitted by the second compound. Preferably, the suppression mechanism is a micro-cavity. However, in some embodiments, the suppression mechanism may be other mechanisms as described above.

The light output of device 500 may be similar to the light output of device 300 as discussed above in terms of 1931 CIE coordinates. In one preferred embodiment, however, device 500 emits red light, having 1931 CIE coordinates of [0.66±0.04, 0.34±0.04], preferably of [0.66±0.02, 0.34±0.02].

Additionally, the first compound 542 may be similar to first compound 342 in terms of the range of wavelength at which its global maximum occurs and capability of phosphorescent emission. Second compound 543 may also be similar to second compound 343 in terms of the range of wavelengths at which its global maximum occurs, capability of phosphorescent emission, and % weight that it is present in the emissive layer. In one preferred embodiment, however, the first compound is capable of red phosphorescent emission with the first wavelength in the range of 590-700 nm and the second compound is capable of yellow phosphorescent emission with the second wavelength in the range of 560-590 nm.

Device 500 is preferably a top-emitting device, but may also be a bottom-emitting device.

Figure 6:
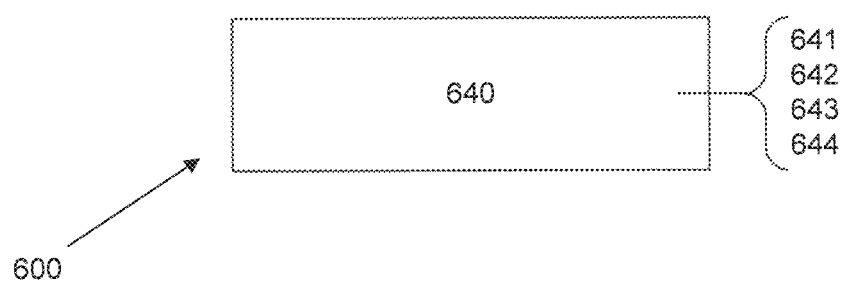
FIG. 6 shows the organic emissive layer of an OLED with three dopants.

FIG. 6 depicts an organic emissive layer 640 of another exemplary device 600 according to one embodiment. Device 600, like device 300, contains a host 641, a first compound 642, and a second compound 643. Second compound 643 is also capable of phosphorescent emission. Second compound 643 has a global maximum in its emission spectrum at a second wavelength. The first wavelength is longer than the second wavelength. The second compound may be present in the organic emissive layer in an amount between 3 and 30 weight %, preferably between 6 and 24 weight %.

First compound 642 is capable of phosphorescent emission. It has a global maximum in its emission spectrum at a first wavelength. Unlike in device 300, however, the first compound 642 of device 600 may be present at any weight %, including amounts greater than 3 weight %. Preferably, the first compound is present in amounts from 1 to 5 weight %.

In embodiments such as this where the amount of the first compound is relaxed, another way to enhance device performance, other than already discussed above in reference to device 500, is to have three or more compounds capable of phosphorescent emission in the organic emissive layer.

Thus, device 600 is different from the devices 300 also because it contains a third compound 644 capable of phosphorescent emission at room temperature its organic emissive layer. The third compound 644 has a global maximum in its visible emission spectrum at a third wavelength. The second wavelength is longer than the third wavelength. It may be present in the organic emissive layer in an amount between 3 and 30 weight %, preferably between 6 and 24 weight %.

In this embodiment, the first wavelength and the second wavelength do not have to be within a specified range of each other. However, in one embodiment, the first wavelength and the second wavelength may be within a specified range of each other.

The light output of device 600 may be similar to the light output of device 300 in terms of CIE coordinates. However, in one preferred embodiment, device 600 emits a red light, having 1931 CIE coordinates of [0.66±0.04, 0.34±0.04], preferably of [0.66±0.02, 0.34±0.02]. The incorporation of these multiple doped emitter materials in the organic emissive layer of an OLED is especially good for a red phosphorescent OLED which can have good EQE, low voltage, and superior lifetime compared to a device with a single doped hole transport material in the emissive layer in an OLED.

While the first, second, and third wavelengths may be of any wavelengths as long as they meet the relationships discussed above, in one preferred embodiment, the first compound is capable of red phosphorescent emission with the first wavelength in the range of 590-700 nm, the second compound is capable of yellow phosphorescent emission with the second wavelength in the range of 560-590 nm, and the third compound is capable of green phosphorescent emission with the third wavelength in the range of 500-560 nm.

Device 600 has a suppression mechanism, similar to the suppression mechanisms of devices 500 and 300. Suppression mechanism of device 600 is capable of preferentially reducing light emitted by the second and third compounds.

Although only three compounds are shown in FIG. 6, device 600 may also include additional compounds capable of phosphorescent emission in its organic emissive layer, such as fourth and fifth compounds. In embodiments with these other compounds, suppression mechanism is capable of preferentially reducing light emission from these compounds as well.

Device 600 is preferably a top-emitting device, but may also be a bottom-emitting device.

While some concepts are described herein with respect to only one of the embodiments of FIG. 3, 5, or 6, and these embodiments are described for a phosphorescent device, one of skilled in the art can readily understand that these concepts can also be applied to the other embodiments. Similarly, any suitable emission principles may be implemented by the compounds and devices disclosed herein, including delayed fluorescence, thermally activated delayed fluorescence, upconversion, downconversion, and the like.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

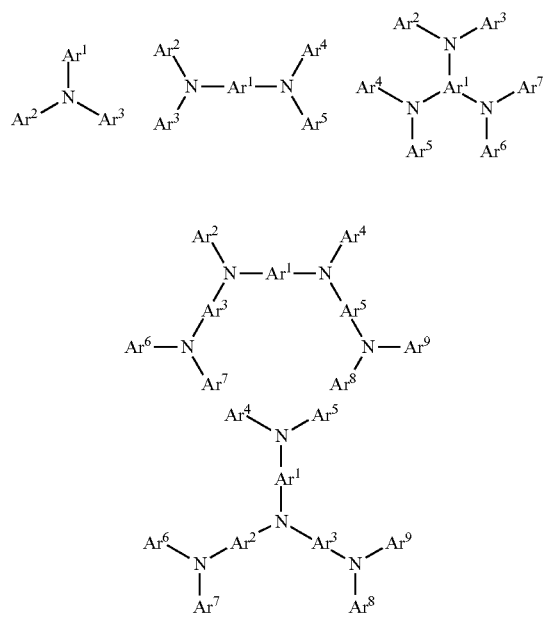

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

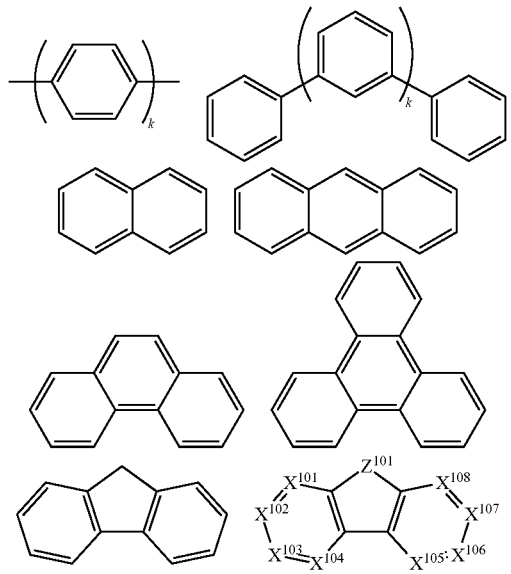

k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

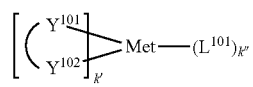

Met is a metal; ($Y^{101}$-$Y^{102}$) is a bidentate ligand, $Y^{101}$ and $Y^{102}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative.

In another aspect, ($Y^{101}$-$Y^{102}$) is a carbene ligand.

In another aspect, Met is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

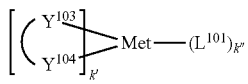

Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

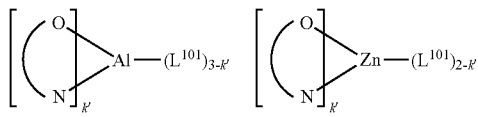

(O—N) is a bidentate ligand, having metal coordinated to atoms O and N.

In another aspect, Met is selected from Ir and Pt.

In a further aspect, ($Y^{103}$-$Y^{104}$) is a carbene ligand.

Examples of organic compounds used as host are selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atome, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof. Additionally, the host can include aza derivatives of some of the above mentioned compounds including but not limited to aza-triphenylene, aza-carbozle, aza-dibenzothiophene, aza-dibenzofuran, and aza-dibenzoselenophene.

In one aspect, host compound contains at least one of the following groups in the molecule:

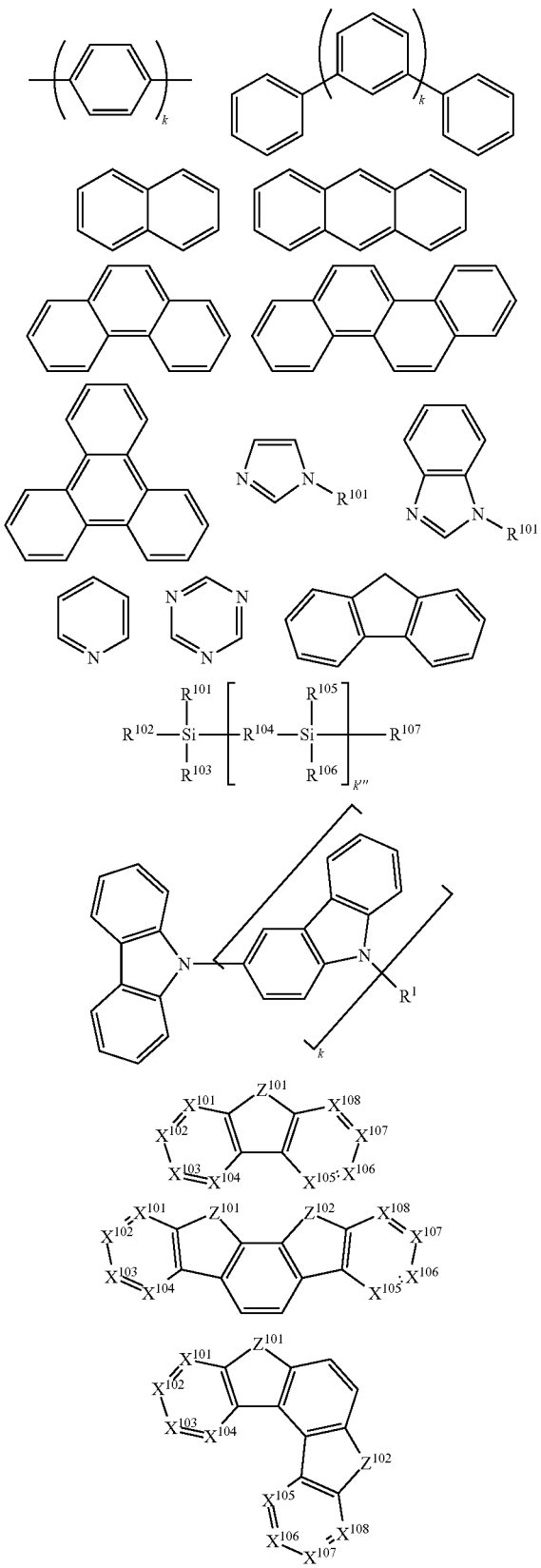

-continued

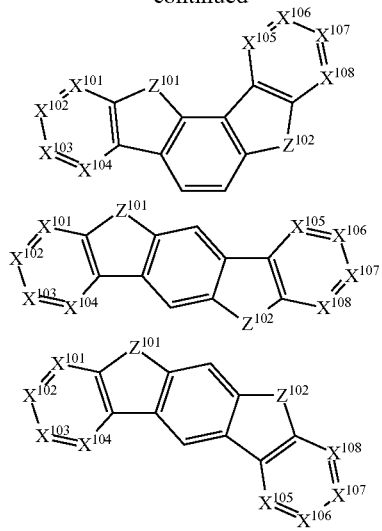

$R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

k is an integer from 1 to 20; k''' is an integer from 0 to 20.

$X^{101}$ to $X^{108}$ is selected from C (including CH) or N.

$Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

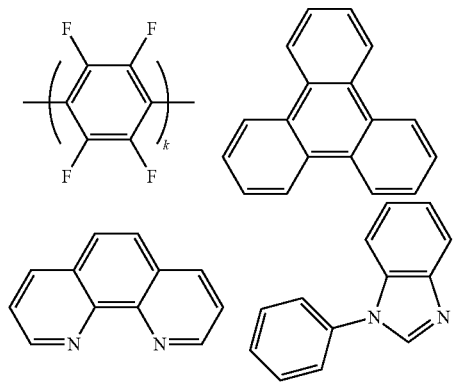

-continued

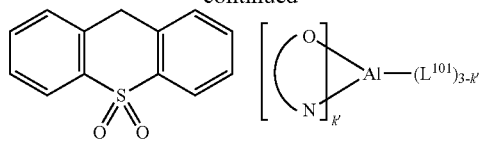

k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

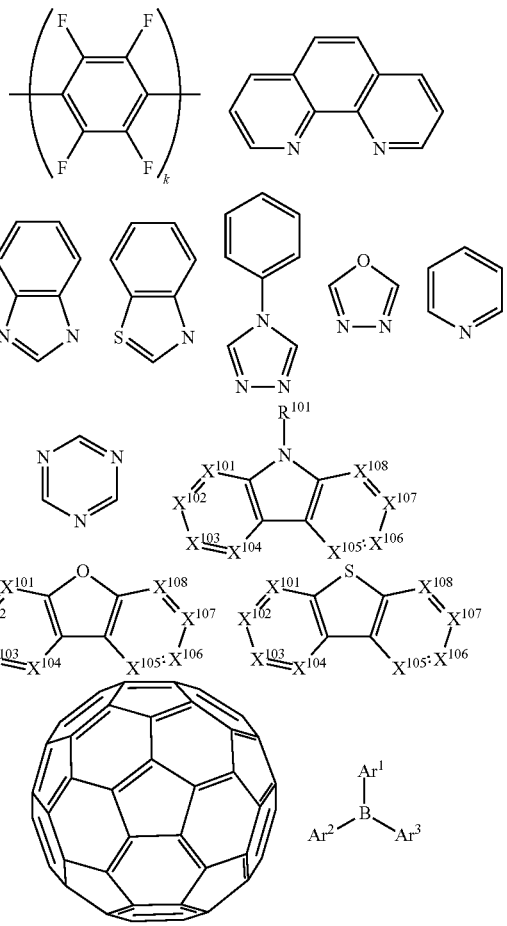

$R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 1 to 20.

$X^{101}$ to $X^{108}$ is selected from C (including CH) or N.

In another aspect, the metal complexes used in ETL contains, but not limit to the following general formula:

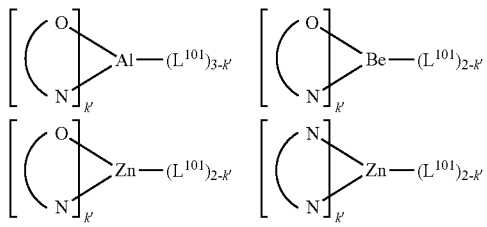

(O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| | Hole injection materials | |
| Phthalocyanine and porphryin compounds | 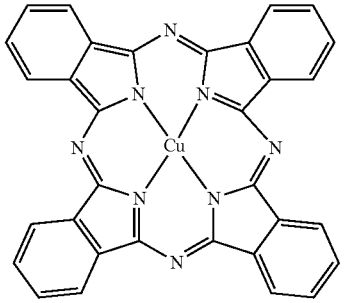 | Appl. Phys. Lett. 69, 2160 (1996) |
| Starburst triarylamines | 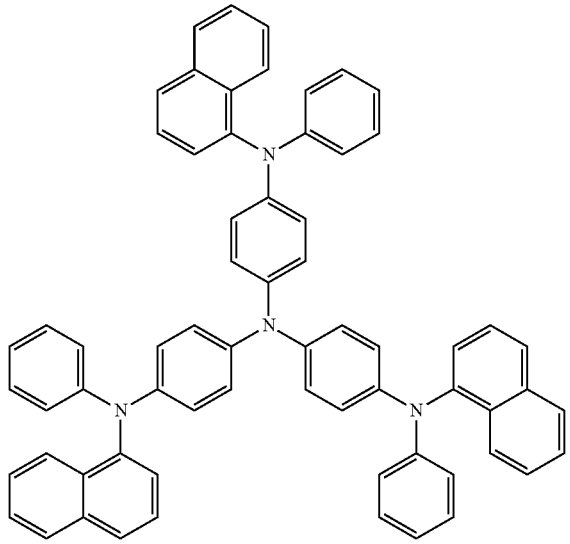 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| CF$_x$ Fluorohydrocarbon polymer | —[CH$_x$F$_y$]$_n$— | Appl. Phys. Lett. 78, 673 (2001) |

TABLE 1-continued
| MATERIAL | EXAMPLES OF MATERIAL | PUBLICATIONS |
|---|---|---|
| Conducting polymers (e.g., PEDOT:PSS, polyaniline, polypthiophene) | 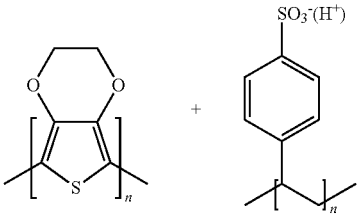 | Synth. Met. 87, 171 (1997) WO2007002683 |
| Phosphonic acid and silane SAMs | 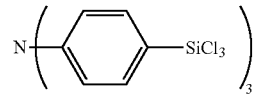 | US20030162053 |
| Triarylamine or polythiophene polymers with conductivity dopants | 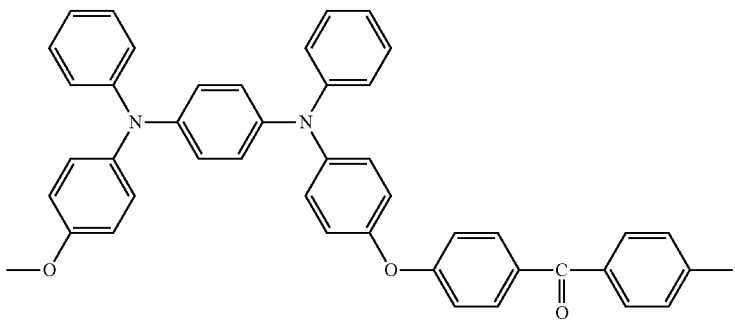 and 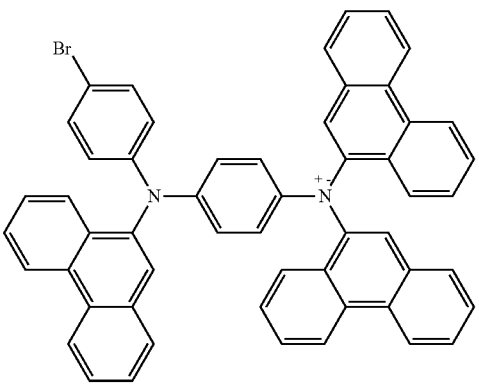 [SMILES: Brc1ccc(N(c2ccc(N(c3cc4ccccc4c4ccccc34)c3cc4ccccc4c4ccccc34)cc2)c2cc3ccccc3c3ccccc23)cc1] 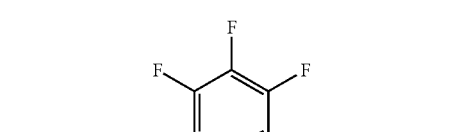 | EP1725079A1 |

TABLE 1-continued
| MATERIAL | EXAMPLES OF MATERIAL | PUBLICATIONS |
|---|---|---|
| Organic compounds with conductive inorganic compounds, such as molybdenum and tungsten oxides | 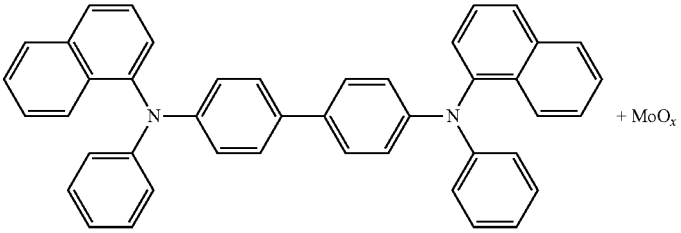 [SMILES: c1ccc(N(c2ccc(-c3ccc(N(c4ccccc4)c4cccc5ccccc45)cc3)cc2)c2cccc3ccccc23)cc1] + MoO$_x$ | US20050123751<br>SID Symposium Digest, 37, 923 (2006)<br>WO2009018009 |
| n-type semi-conducting organic complexes | 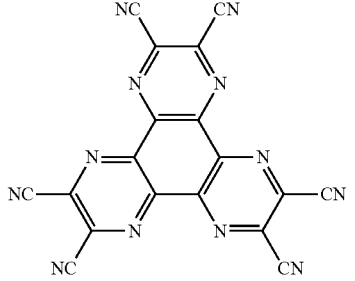 [SMILES: N#Cc1nc2c3nc(C#N)c(C#N)nc3c3nc(C#N)c(C#N)nc3c2nc1C#N] | US20020158242 |
| Metal organometallic complexes | 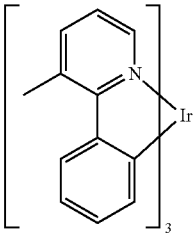 | US20060240279 |
| Cross-linkable compounds | 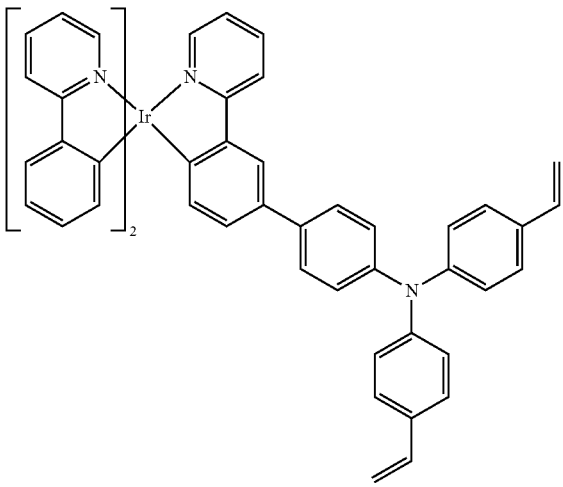 | US20080220265 |

TABLE 1-continued

| MATERIAL | EXAMPLES OF MATERIAL | PUBLICATIONS |
| --- | --- | --- |
| Polythiophene based polymers and copolymers | | WO 2011075644<br>EP2350216 |ие

Hole transporting materials

| | | |
| --- | --- | --- |
| Triarylamines (e.g., TPD, α-NPD) | | Appl. Phys. Lett. 51, 913 (1987) |
| | | U.S. Pat. No. 5,061,569 |
| | | EP650955 |

TABLE 1-continued
| MATERIAL | EXAMPLES OF MATERIAL | PUBLICATIONS |
|---|---|---|
| | 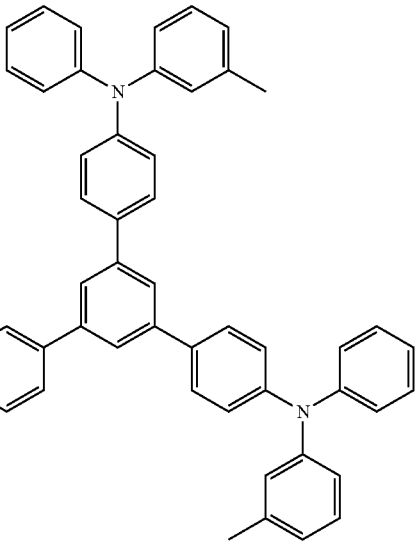 | J. Mater. Chem. 3, 319 (1993) |
| | 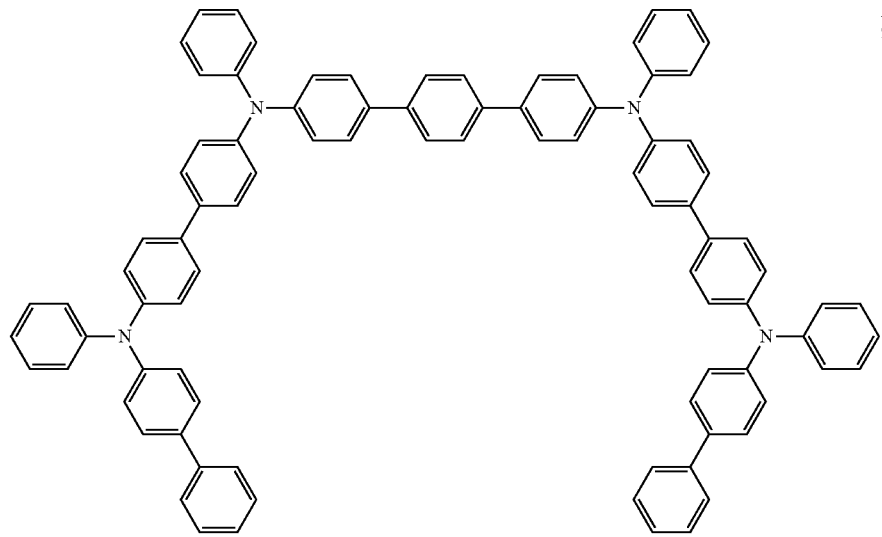 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
| | 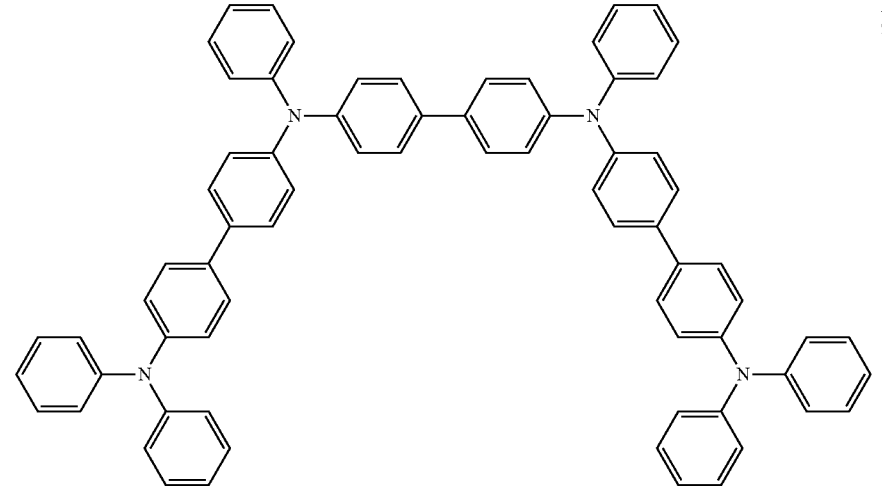 | Appl. Phys. Lett. 90, 183503 (2007) |

TABLE 1-continued

| MATERIAL | EXAMPLES OF MATERIAL | PUBLICATIONS |
| --- | --- | --- |
| Triarylamine on spirofluorene core | | Synth. Met. 91, 209 (1997) |
| Arylamine carbazole compounds | | Adv. Mater. 6, 677 (1994), US20080124572 |
| Triarylamine with (di)benzothiophene/ (di)benzofuran | | US20070278938, US20080106190 US20110163302 |
| Indolocarbazoles | | Synth. Met. 111, 421 (2000) |

TABLE 1-continued

| MATERIAL | EXAMPLES OF MATERIAL | PUBLICATIONS |
|---|---|---|
| Isoindole compounds | | Chem. Mater. 15, 3148 (2003) |
| Metal carbene complexes | | US20080018221 |

Phosphorescent OLED host materials
Red hosts

| | | |
|---|---|---|
| Aryl-carbazoles | | Appl. Phys. Lett. 78, 1622 (2001) |
| Metal 8-hydroxy-quinolates (e.g., Alq$_3$, BAlq) | | Nature 395, 151 (1998) |
| | | US20060202194 |

TABLE 1-continued
| MATERIAL | EXAMPLES OF MATERIAL | PUBLICATIONS |
| --- | --- | --- |
| | 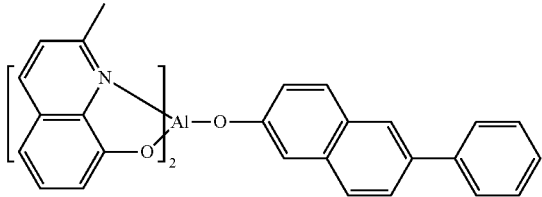 | WO2005014551 |
| | 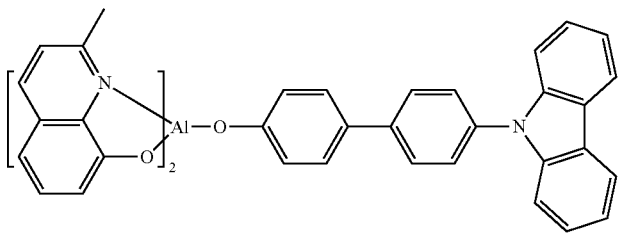 | WO2006072002 |
| Metal phenoxy-benzothiazole compounds | 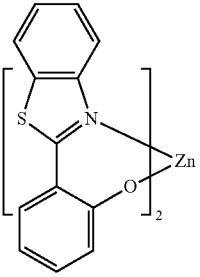 | Appl. Phys. Lett. 90, 123509 (2007) |
| Conjugated oligomers and polymers (e.g., polyfluorene) | 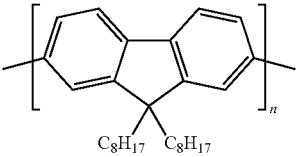 | Org. Electron. 1, 15 (2000) |
| Aromatic fused rings | 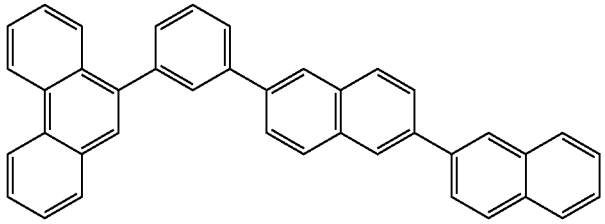 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |
| Zinc complexes | 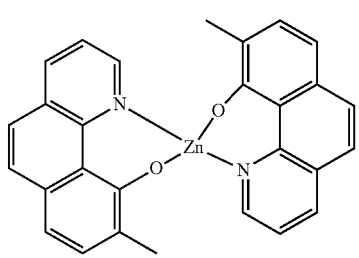 | WO2010056066 |

| MATERIAL | EXAMPLES OF MATERIAL | PUBLICATIONS |
|---|---|---|
| Chrysene based compounds | 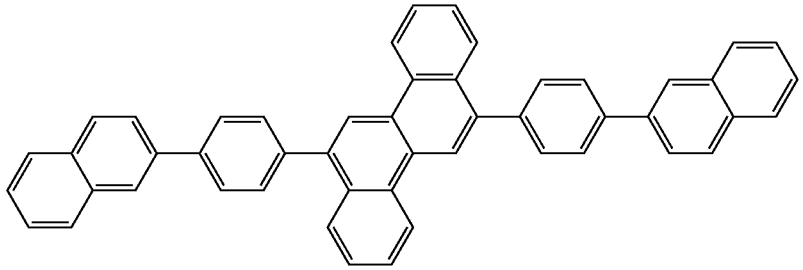 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| Green hosts | | |
| Aryl-carbazoles | 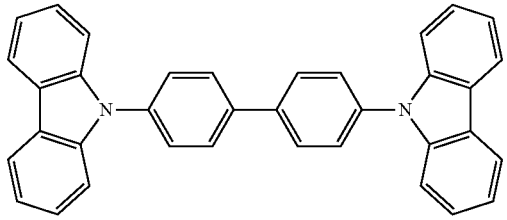 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 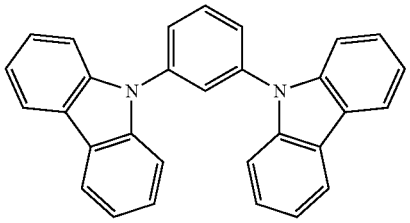 [SMILES: c1cc(-n2c3ccccc3c3ccccc32)cc(-n2c3ccccc3c3ccccc32)c1] | US20030175553 |
| | 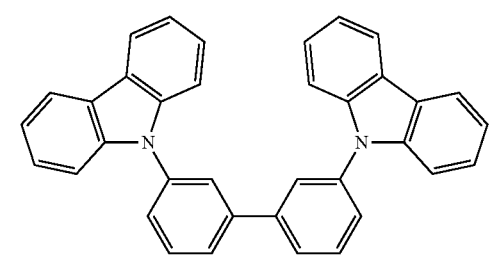 [SMILES: c1cc(-c2cccc(-n3c4ccccc4c4ccccc43)c2)cc(-n2c3ccccc3c3ccccc32)c1] | WO2001039234 |
| Aryl-triphenylene compounds | 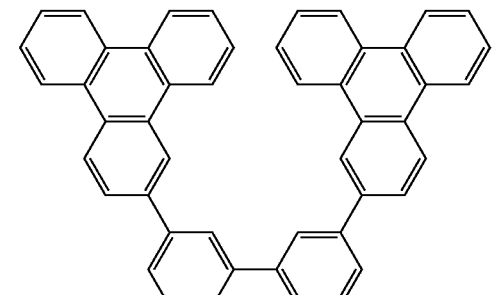 | US20060280965 |

TABLE 1-continued
| MATERIAL | EXAMPLES OF MATERIAL | PUBLICATIONS |
|---|---|---|
| | 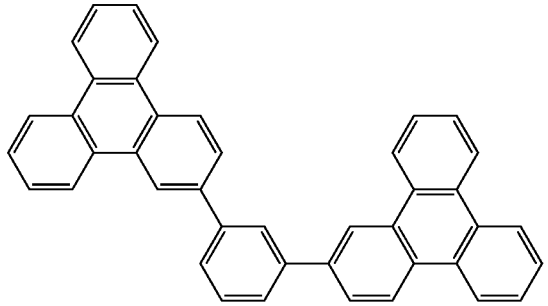 [SMILES: c1cc(-c2ccc3c4ccccc4c4ccccc4c3c2)cc(-c2ccc3c4ccccc4c4ccccc4c3c2)c1] | US20060280965 |
| | 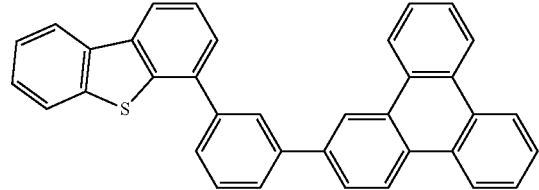 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 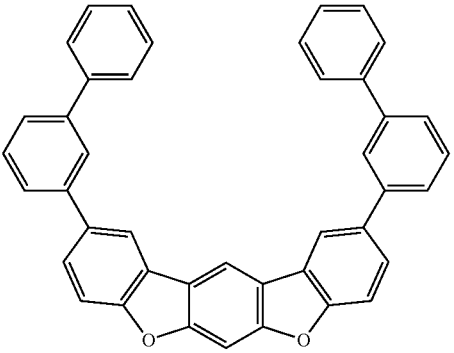 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 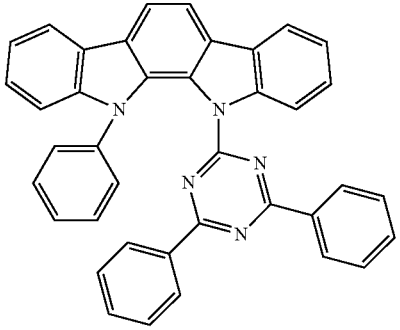 [SMILES: c1ccc(-c2nc(-c3ccccc3)nc(-n3c4ccccc4c4ccc5c6ccccc6n(-c6ccccc6)c5c43)n2)cc1] | WO2008056746 |
| | 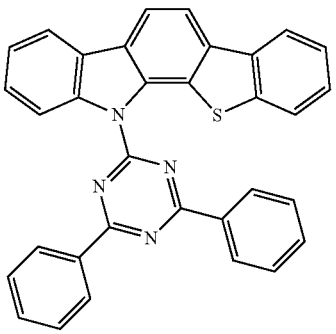 [SMILES: c1ccc(-c2nc(-c3ccccc3)nc(-n3c4ccccc4c4ccc5c6ccccc6sc5c43)n2)cc1] | WO2010107244 |

TABLE 1-continued
| MATERIAL | EXAMPLES OF MATERIAL | PUBLICATIONS |
|---|---|---|
| Aza-carbazole/ DBT/DBF | 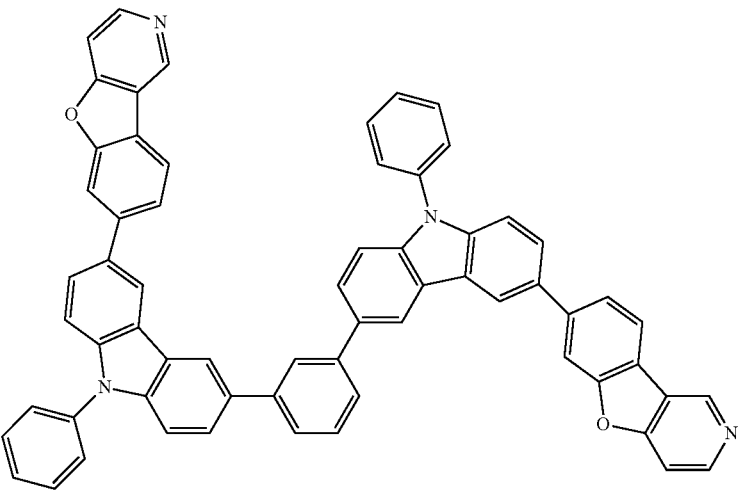 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 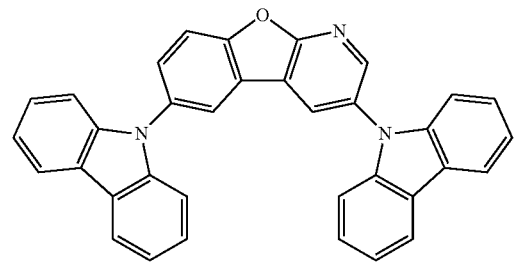 [SMILES: c1ccc2c(c1)c1ccccc1n2-c1ccc2oc3ncc(-n4c5ccccc5c5ccccc54)cc3c2c1] | US2010087984 |
| Polymers (e.g., PVK) | 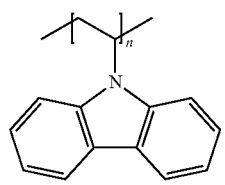 | Appl. Phys. Lett. 77, 2280 (2000) |
| Spirofluorene compounds | 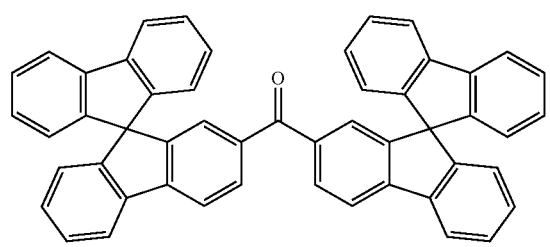 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |
| Metal phenoxy-benzo-oxazole compounds | 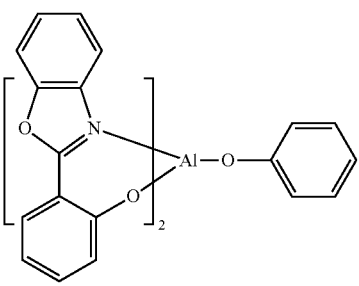 | WO2005089025 |

TABLE 1-continued
| MATERIAL | EXAMPLES OF MATERIAL | PUBLICATIONS |
|---|---|---|
| | 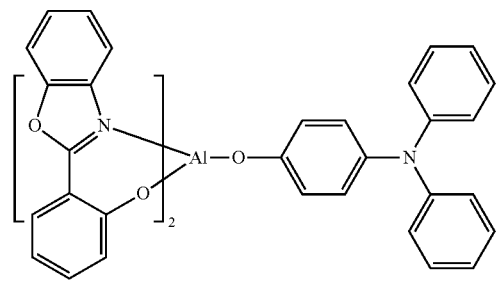 | WO2006132173 |
| | 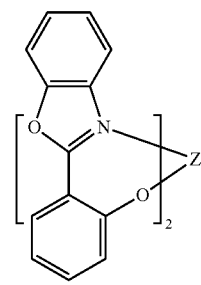 | JP200511610 |
| Spiro-fluorene-carbazole compounds | 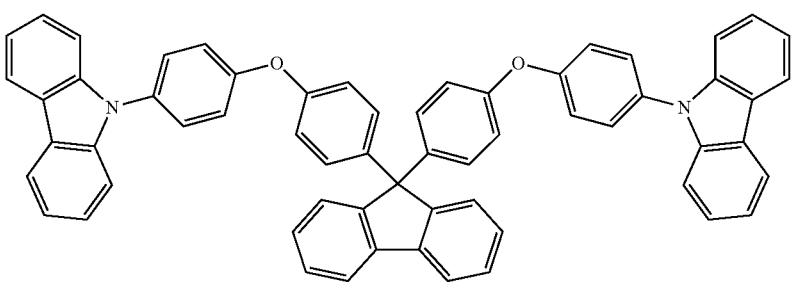 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 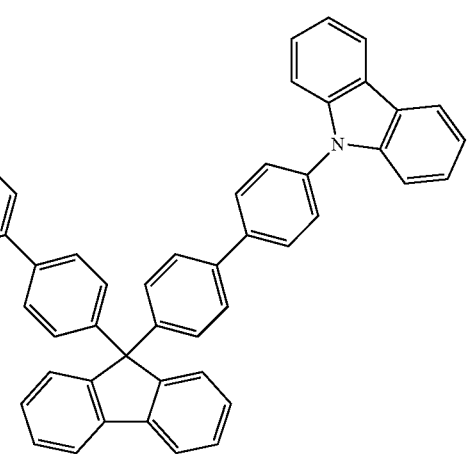 | JP2007254297 |
| Indolo-carbazole | 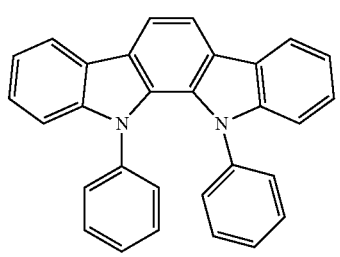 [SMILES: c1ccc(-n2c3ccccc3c3ccc4c5ccccc5n(-c5ccccc5)c4c32)cc1] | WO2007063796 |

TABLE 1-continued
| MATERIAL | EXAMPLES OF MATERIAL | PUBLICATIONS |
|---|---|---|
| | 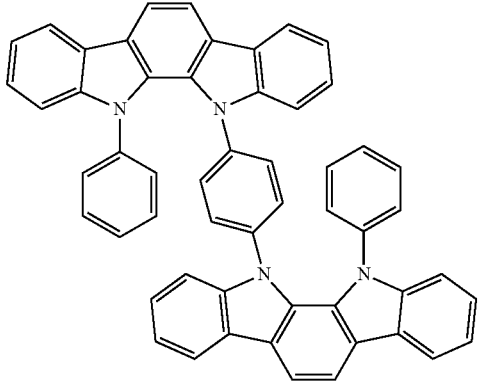 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles | 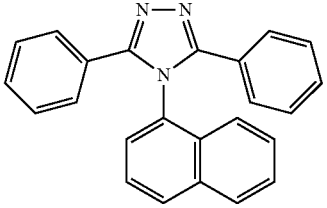 [SMILES: c1ccc(-c2nnc(-c3ccccc3)n2-c2cccc3ccccc23)cc1] | J. Appl. Phys. 90, 5048 (2001) |
| (e.g., triazole, oxadiazole) | 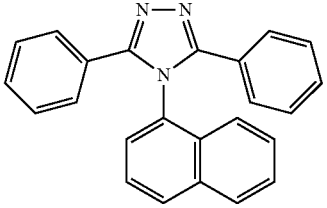 [SMILES: c1ccc(-c2nnc(-c3ccccc3)n2-c2cccc3ccccc23)cc1] | WO2004107822 |
| Tetra-phenylene complexes | 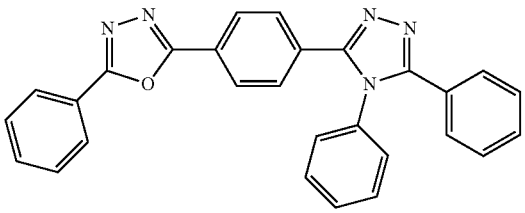 [SMILES: c1ccc(-c2nnc(-c3ccc(-c4nnc(-c5ccccc5)n4-c4ccccc4)cc3)o2)cc1] | US20050112407 |
| Metal phenoxy-pyridine compounds | 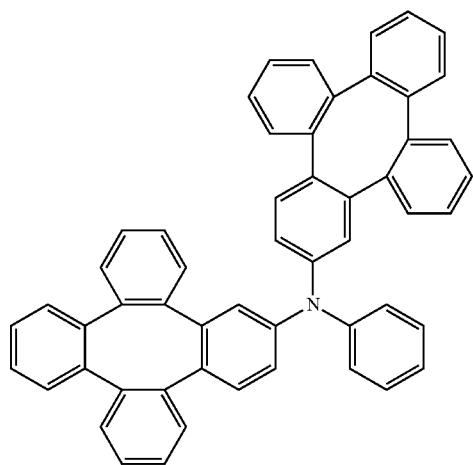 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | WO2005030900 |

TABLE 1-continued

| MATERIAL | EXAMPLES OF MATERIAL | PUBLICATIONS |
| --- | --- | --- |
| Metal coordination complexes (e.g., Zn, Al with N^N ligands) | (structure of Zn complex with pyrazole-pyridine ligands) | US20040137268, US20040137267 |

Blue hosts

| MATERIAL | EXAMPLES OF MATERIAL | PUBLICATIONS |
| --- | --- | --- |
| Aryl-carbazoles | (1,3-bis(carbazol-9-yl)benzene structure) | Appl. Phys. Lett, 82, 2422 (2003) |
| | (bis-carbazole biphenyl structure) | US20070190359 |
| Dibenzo-thiophene/ Dibenzo-furan-carbazole compounds | (dibenzothiophene with two carbazoles at 2,8-positions) | WO2006114966, US20090167162 |
| | (dibenzothiophene with two carbazoles at 4,6-positions) | US20090167162 |

TABLE 1-continued
| MATERIAL | EXAMPLES OF MATERIAL | PUBLICATIONS |
|---|---|---|
| | 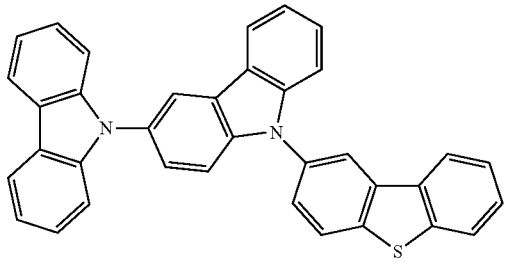 [SMILES: c1ccc2c(c1)sc1ccc(-n3c4ccccc4c4cc(-n5c6ccccc6c6ccccc65)ccc43)cc12] | WO2009086028 |
| | 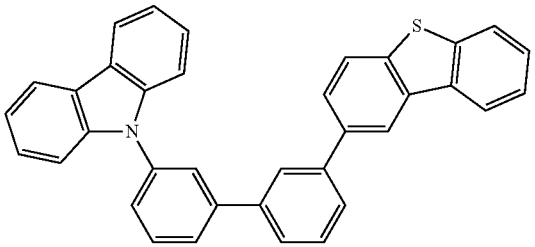 [SMILES: c1cc(-c2cccc(-n3c4ccccc4c4ccccc43)c2)cc(-c2ccc3sc4ccccc4c3c2)c1] | US20090030202, US20090017330 |
| | 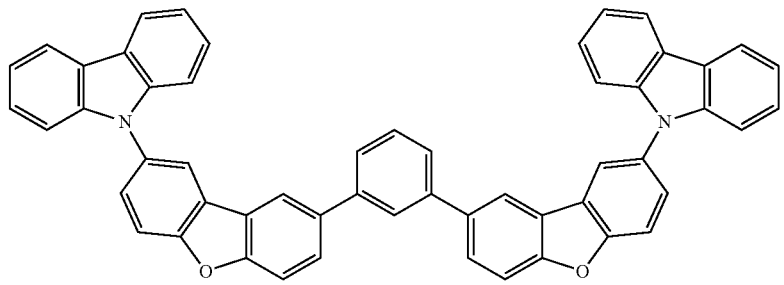 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 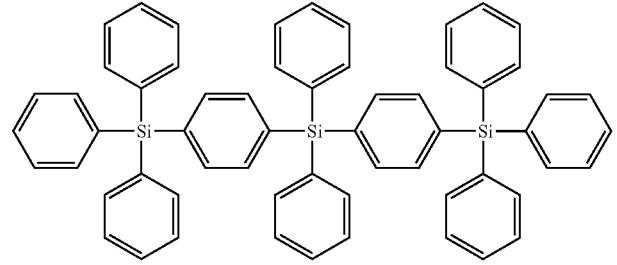 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 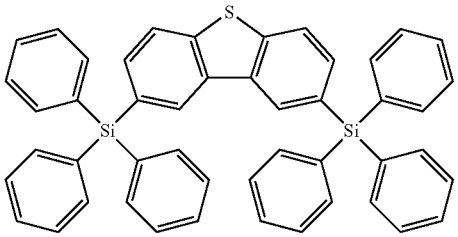 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 1-continued

| MATERIAL | EXAMPLES OF MATERIAL | PUBLICATIONS |
|---|---|---|
| Silicon/Germanium aryl compounds | | EP2034538A |
| Aryl benzoyl ester | | WO2006100298 |
| Carbazole linked by non-conjugated groups | | US20040115476 |
| Aza-carbazoles | | US20060121308 |
| High triplet metal organo-metallic complex | | U.S. Pat. No. 7,154,114 |

TABLE 1-continued

| MATERIAL | EXAMPLES OF MATERIAL | PUBLICATIONS |
|---|---|---|
| | Phosphorescent dopants | |
| | Red dopants | |
| Heavy metal porphyrins (e.g., PtOEP) | | Nature 395, 151 (1998) |
| Iridium(III) organo-metallic complexes | | Appl. Phys. Lett. 78, 1622 (2001) |
| | | US20030072964 |
| | | US20030072964 |
| | | US20060202194 |

TABLE 1-continued
| MATERIAL | EXAMPLES OF MATERIAL | PUBLICATIONS |
|---|---|---|
| | 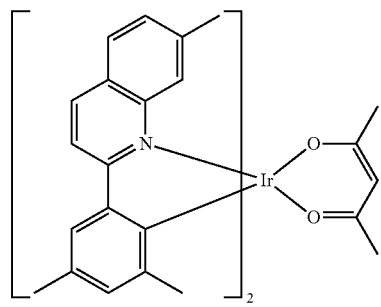 | US20060202194 |
| | 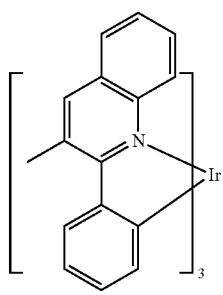 | US20070087321 |
| | 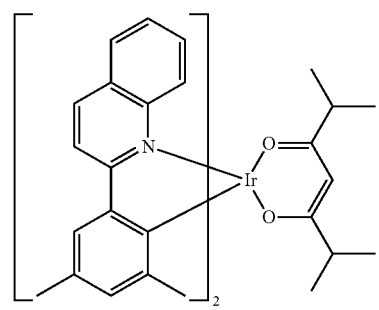 | US20080261076<br>US20100090591 |
| | 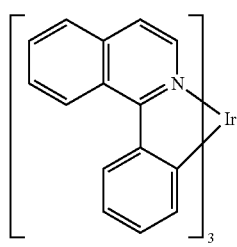 | US20070087321 |
| | 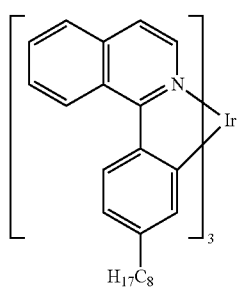 | Adv. Mater. 19, 739 (2007) |

TABLE 1-continued
| MATERIAL | EXAMPLES OF MATERIAL | PUBLICATIONS |
|---|---|---|
| | 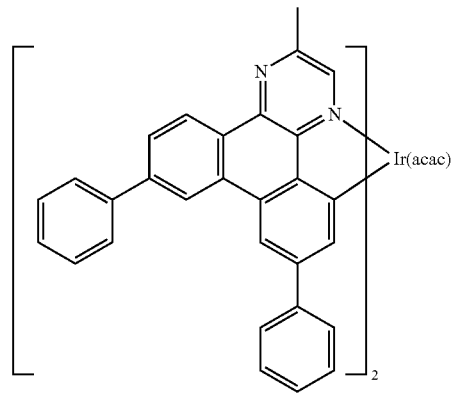 | WO2009100991 |
| | 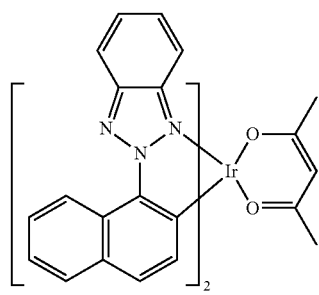 | WO2008101842 |
| | 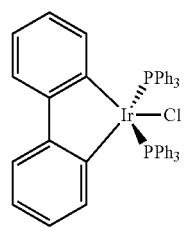 | U.S. Pat. No. 7,232,618 |
| Platinum(II) organo-metallic complexes | 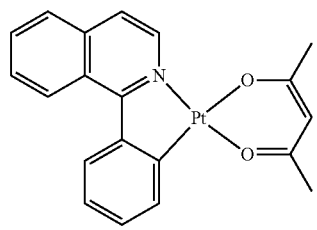 | WO2003040257 |
| | 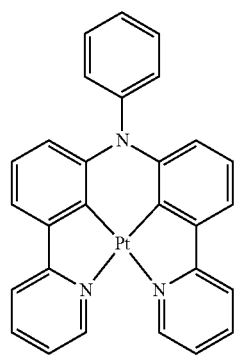 | US20070103060 |

TABLE 1-continued

| MATERIAL | EXAMPLES OF MATERIAL | PUBLICATIONS |
|---|---|---|
| Osminum (III) complexes | [structure: pyrazole with CF$_3$ group linked to pyridine, coordinated to Os(PPhMe$_2$)$_2$, subscript 2] | Chem. Mater. 17, 3532 (2005) |
| Ruthenium (II) complexes | [structure: tBu-pyrazole linked to isoquinoline, coordinated to Ru(PPhMe$_2$)$_2$, subscript 2] | Adv. Mater. 17, 1059 (2005) |
| Rhenium (I), (II), and (III) complexes | [structure: 8-hydroxyquinoline coordinated to Re—(CO)$_4$] | US20050244673 |

Green dopants

| MATERIAL | EXAMPLES OF MATERIAL | PUBLICATIONS |
|---|---|---|
| Iridium(III) organometallic complexes | [structure: Ir(ppy)$_3$] and its derivatives | Inorg. Chem. 40, 1704 (2001) |
| | [structure: Ir(ppy)$_2$(acac)] | US20020034656 |

TABLE 1-continued
| MATERIAL | EXAMPLES OF MATERIAL | PUBLICATIONS |
|---|---|---|
| | 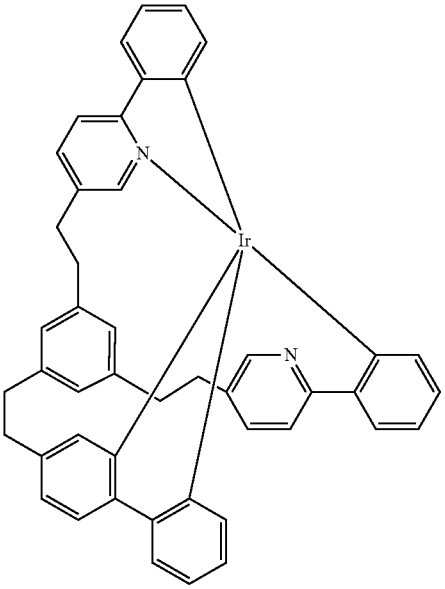 | U.S. Pat. No. 7,332,232 |
| | 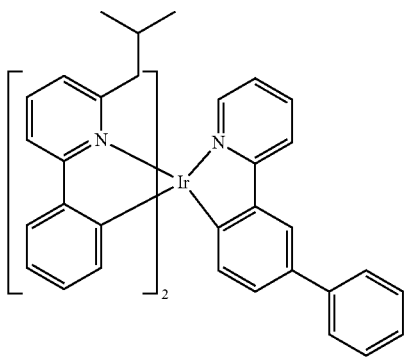 | US20090108737 |
| | 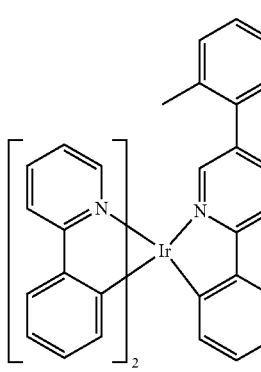 | WO2010028151 |

TABLE 1-continued

| MATERIAL | EXAMPLES OF MATERIAL | PUBLICATIONS |
|---|---|---|
| | | EP1841834B |
| | | US20060127696 |
| | | US20090039776 |
| | | U.S. Pat. No. 6,921,915 |
| | | US20100244004 |

TABLE 1-continued
| MATERIAL | EXAMPLES OF MATERIAL | PUBLICATIONS |
|---|---|---|
| | 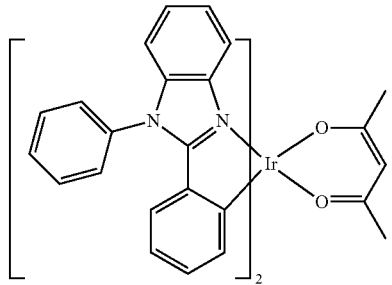 | U.S. Pat. No. 6,687,266 |
| | 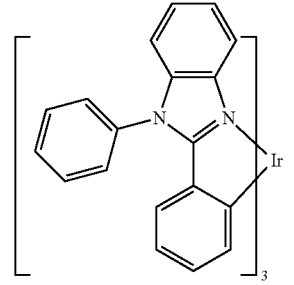 | Chem. Mater. 16, 2480 (2004) |
| | 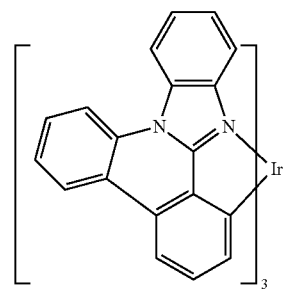 | US20070190359 |
| | 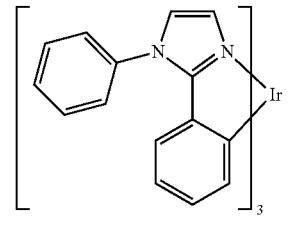 | US 20060008670 JP2007123392 |
| | 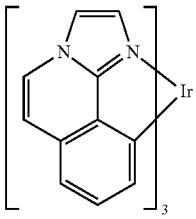 | WO2010086089, WO2011044988 |

TABLE 1-continued

| MATERIAL | EXAMPLES OF MATERIAL | PUBLICATIONS |
|---|---|---|
| | | Adv. Mater. 16, 2003 (2004) |
| | | Angew. Chem. Int. Ed. 2006, 45, 7800 |
| | | WO2009050290 |
| | | US20090165846 |
| | | US20080015355 |

TABLE 1-continued

| MATERIAL | EXAMPLES OF MATERIAL | PUBLICATIONS |
| --- | --- | --- |
| | | US20010015432 |
| | | US20100295032 |
| Monomer for polymeric metal organo-metallic compounds | | U.S. Pat. No. 7,250,226, U.S. Pat. No. 7,396,598 |
| Pt(II) organo-metallic complexes, including polydentated ligands | | Appl. Phys. Lett. 86, 153505 (2005) |
| | | Appl. Phys. Lett. 86, 153505 (2005) |

TABLE 1-continued

| MATERIAL | EXAMPLES OF MATERIAL | PUBLICATIONS |
|---|---|---|
| | | Chem. Lett. 34, 592 (2005) |
| | | WO2002015645 |
| | | US20060263635 |
| | | US20060182992<br>US20070103060 |

TABLE 1-continued
| MATERIAL | EXAMPLES OF MATERIAL | PUBLICATIONS |
|---|---|---|
| Cu complexes | 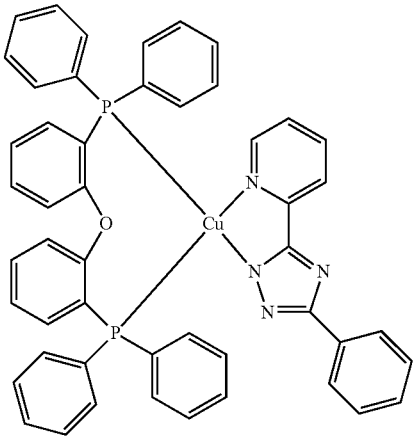 | WO2009000673 |
|  | 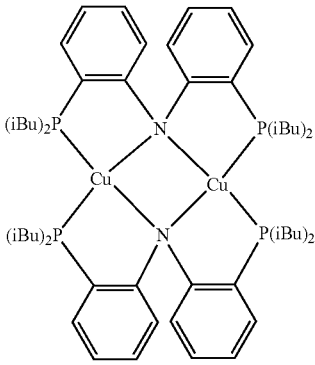 | US20070111026 |
| Gold complexes | 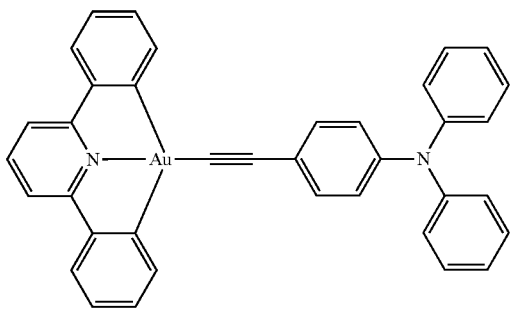 | Chem. Commun. 2906 (2005) |
| Rhenium (III) complexes | 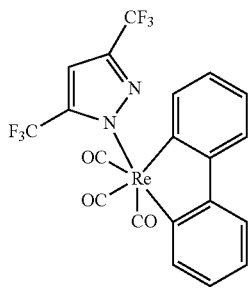 | Inorg. Chem. 42, 1248 (2003) |

TABLE 1-continued

| MATERIAL | EXAMPLES OF MATERIAL | PUBLICATIONS |
| --- | --- | --- |
| Osmium (II) complexes | | U.S. Pat. No. 7,279,704 |
| Deuterated organometallic complexes | | US20030138657 |
| Organometallic complexes with two or more metal centers | | US20030152802 |
| | | U.S. Pat. No. 7,090,928 |

TABLE 1-continued
| MATERIAL | EXAMPLES OF MATERIAL | PUBLICATIONS |
|---|---|---|
| | Blue dopants | |
| Iridium(III) organo-metallic complexes | 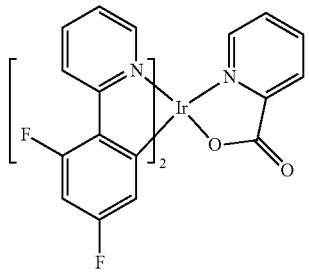 | WO2002002714 |
| | 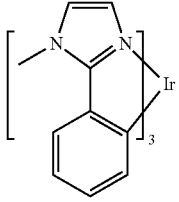 | WO2006009024 |
| | 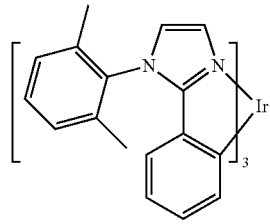 | US20060251923<br>US20110057559<br>US20110204333 |
| | 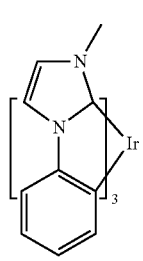 | U.S. Pat. No. 7,393,599,<br>WO2006056418,<br>US20050260441,<br>WO2005019373 |
| | 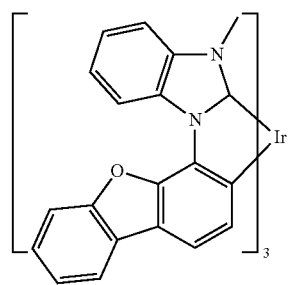 | U.S. Pat. No. 7,534,505 |

TABLE 1-continued

| MATERIAL | EXAMPLES OF MATERIAL | PUBLICATIONS |
|---|---|---|
| | | WO2011051404 |
| | | U.S. Pat. No. 7,445,855 |
| | | US20070190359, US20080297033 US20100148663 |
| | | U.S. Pat. No. 7,338,722 |
| | | US20020134984 |

TABLE 1-continued

| MATERIAL | EXAMPLES OF MATERIAL | PUBLICATIONS |
|---|---|---|
| | | Angew. Chem. Int. Ed. 47, 4542 (2008) |
| | | Chem. Mater. 18, 5119 (2006) |
| | | Inorg. Chem. 46, 4308 (2007) |
| | | WO2005123873 |
| | | WO2005123873 |

TABLE 1-continued

| MATERIAL | EXAMPLES OF MATERIAL | PUBLICATIONS |
| --- | --- | --- |
| | | WO2007004380 |
| | | WO2006082742 |
| Osmium(II) complexes | | U.S. Pat. No. 7,279,704 |
| | | Organometallics 23, 3745 (2004) |
| Gold complexes | | Appl. Phys. Lett. 74, 1361 (1999) |

TABLE 1-continued

| MATERIAL | EXAMPLES OF MATERIAL | PUBLICATIONS |
|---|---|---|
| Platinum(II) complexes | 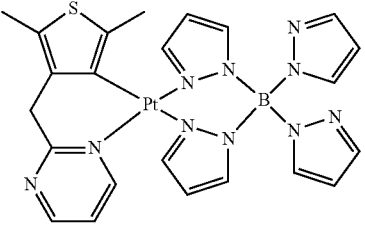 | WO2006098120, WO2006103874 |
| Pt tetradentate complexes with at least one metal-carbene bond | 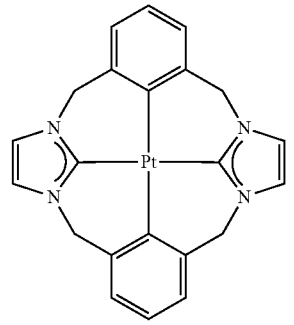 | U.S. Pat. No. 7,655,323 |

Exciton/hole blocking layer materials

| MATERIAL | EXAMPLES OF MATERIAL | PUBLICATIONS |
|---|---|---|
| Bathocuprine compounds (e.g., BCP, BPhen) | 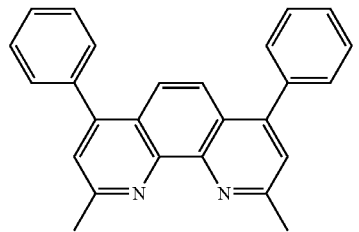 [SMILES: Cc1cc(-c2ccccc2)c2ccc3c(-c4ccccc4)cc(C)nc3c2n1] | Appl. Phys. Lett. 75, 4 (1999) |
| | 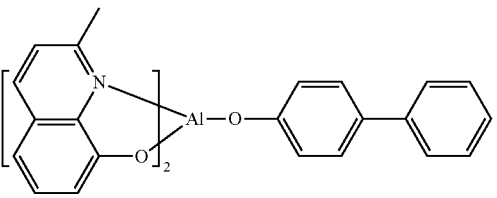 | Appl. Phys. Lett. 79, 449 (2001) |
| Metal 8-hydroxyquinolates (e.g., BAlq) | | Appl. Phys. Lett. 81, 162 (2002) |

TABLE 1-continued

| MATERIAL | EXAMPLES OF MATERIAL | PUBLICATIONS |
| --- | --- | --- |
| 5-member ring electron deficient heterocycles such as triazole, oxadiazole, imidazole, benzo-imidazole | | Appl. Phys. Lett. 81, 162 (2002) |
| Triphenylene compounds | | US20050025993 |
| Fluorinated aromatic compounds | | Appl. Phys. Lett. 79, 156 (2001) |

TABLE 1-continued
| MATERIAL | EXAMPLES OF MATERIAL | PUBLICATIONS |
|---|---|---|
| Phenothiazine-S-oxide | 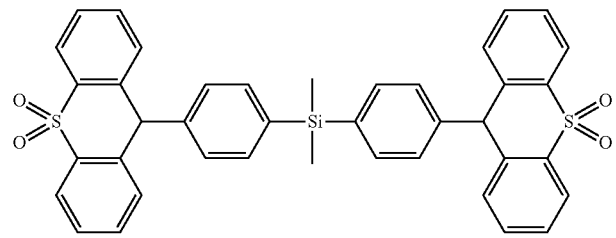 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Silylated five-membered nitrogen, oxygen, sulfur or phosphorus dibenzoheterocycles | 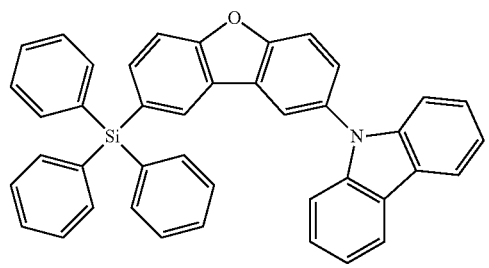 [SMILES: c1ccc([Si](c2ccccc2)(c2ccccc2)c2ccc3oc4ccc(-n5c6ccccc6c6ccccc65)cc4c3c2)cc1] | WO2010079051 |
| Azacarbazoles | 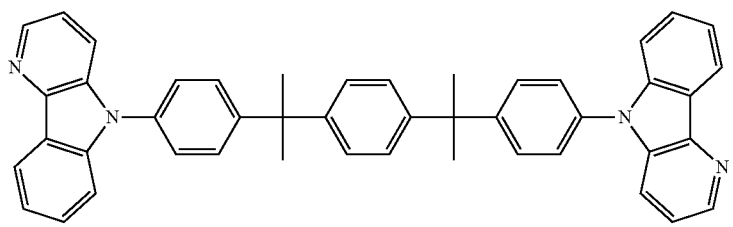 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
Electron transporting materials
| | | |
|---|---|---|
| Anthracene-benzoimidazole compounds | 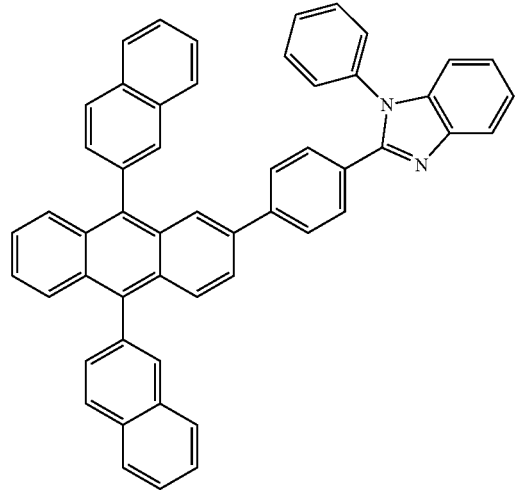 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |

TABLE 1-continued
| MATERIAL | EXAMPLES OF MATERIAL | PUBLICATIONS |
|---|---|---|
| | 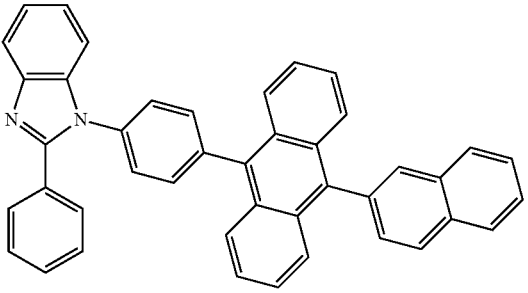 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 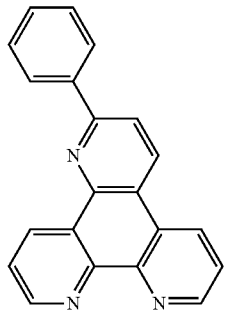 [SMILES: c1ccc(-c2ccc3c4cccnc4c4ncccc4c3n2)cc1] | US20090115316 |
| Anthracene-benzothiazole compounds | 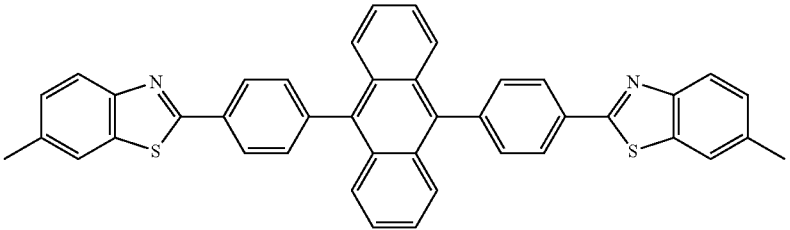 | Appl. Phys. Lett. 89, 063504 (2006) |
| Metal 8-hydroxyquinolates (e.g., Alq$_3$, Zrq$_4$) | 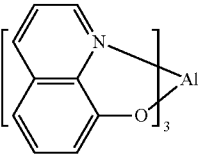 | Appl. Phys. Lett. 51, 913 (1987) U.S. Pat. No. 7,230,107 |
| Metal hydroxybenoquinolates | 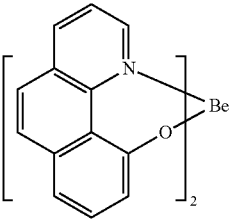 | Chem. Lett. 5, 905 (1993) |
| Bathocuprine compounds such as BCP, BPhen, etc | 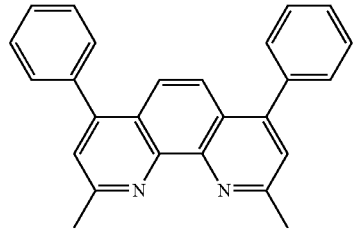 [SMILES: Cc1cc(-c2ccccc2)c2ccc3c(-c4ccccc4)cc(C)nc3c2n1] | Appl. Phys. Lett. 91, 263503 (2007) |

TABLE 1-continued

| MATERIAL | EXAMPLES OF MATERIAL | PUBLICATIONS |
|---|---|---|
| | | Appl. Phys. Lett. 79, 449 (2001) |
| 5-member ring electron deficient heterocycles (e.g., triazole, oxadiazole, imidazole, benzo-imidazole) | | Appl. Phys. Lett. 74, 865 (1999) |
| | | Appl. Phys. Lett. 55, 1489 (1989) |
| | | Jph. J. Apply. Phys. 32, L917 (1993) |
| Silole compounds | | Org. Electron. 4, 113 (2003) |

TABLE 1-continued

| MATERIAL | EXAMPLES OF MATERIAL | PUBLICATIONS |
| --- | --- | --- |
| Arylborane compounds | | J. Am. Chem. Soc. 120, 9714 (1998) |
| Fluorinated aromatic compounds | | J. Am. Chem. Soc. 122, 1832 (2000) |
| Fullerene (e.g., C60) | | US20090101870 |
| Triazine complexes | | US20040036077 |
| Zn (N^N) complexes | | U.S. Pat. No. 6,528,187 |

EXPERIMENTAL

As way of non-limiting examples, several model and comparative devices were constructed and will now be discussed. All devices were fabricated by high vacuum (<10⁻⁷ Torr) thermal evaporation. While all devices discussed here were fabricated by this method, other methods can be used to fabricate these devices. The cathode consisted of 1 nm of LiF as an electron injection layer (EIL) followed by 100 nm of Al. All devices are encapsulated with a glass lid sealed with an epoxy resin in a nitrogen glove box (<1 ppm of $H_2O$ and $O_2$) immediately after fabrication, and a moisture getter was incorporated inside the package.

Model Devices 1-1 to 1-4: Top Emission Micro-Cavity with Two Components

Figure 7:
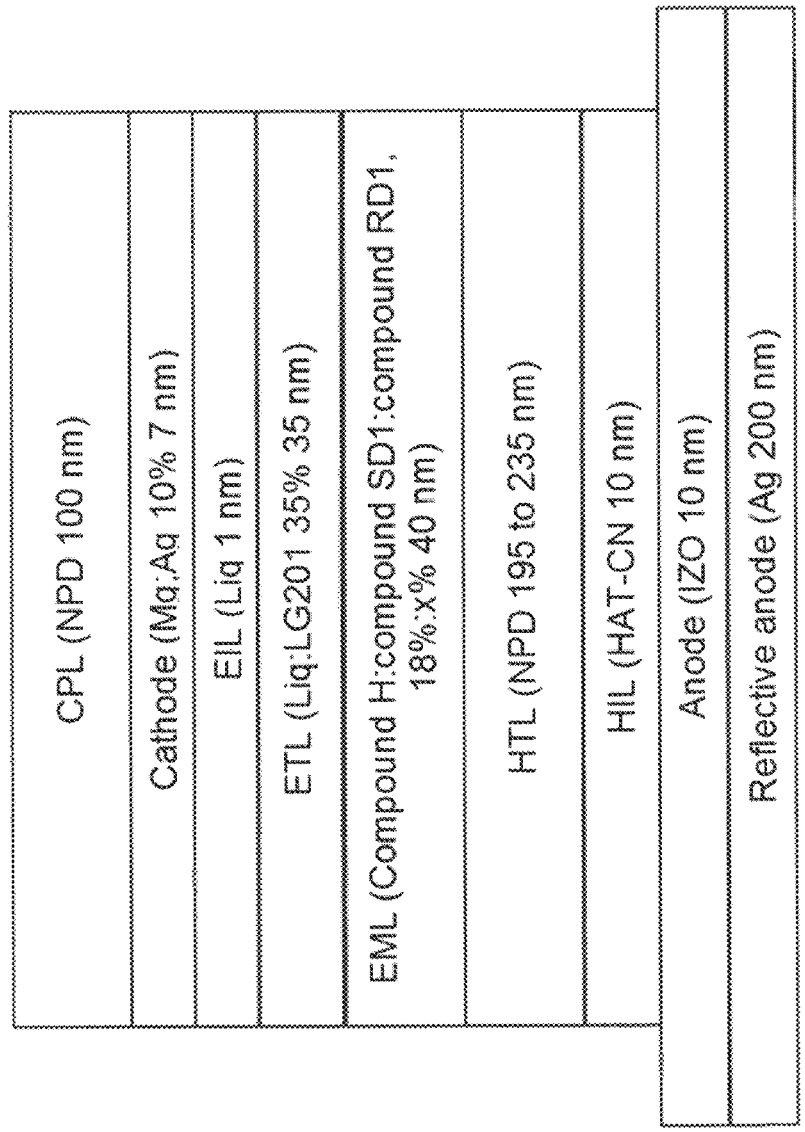
FIG. 7 shows an exemplary structure of an OLED with two dopants.

Four types of Model Device 1 were constructed, 1-1 to 1-4. These devices are all top emitting devices. As shown in FIG. 7, the cathode consisted of 120 nm of ITO. HAT-CN was used as a hole injection layer (with a thickness of 10 nm). NPD (bis[N-(1-naphthyl)-N-phenylamino]biphenyl) was used as a hole transporting layer. Liq doped with 35% LG201 was used as an electron transporting layer (35 nm). The organic emissive layer of Model Device 1 was comprised of host H, SD1 compound, and RD1 compound. The chemical formulas for H, Liq, SD1, and RD1 are shown below:

SD1
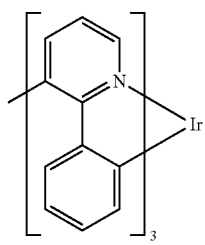

RD1
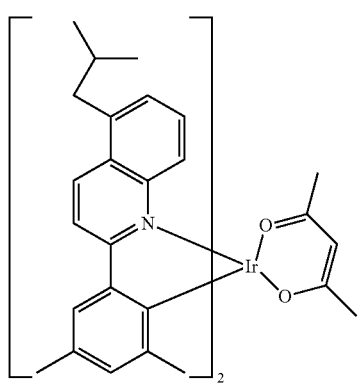

Liq
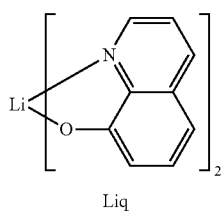

H
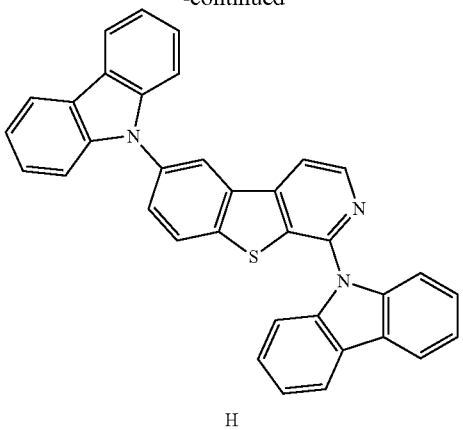

Figure 10:
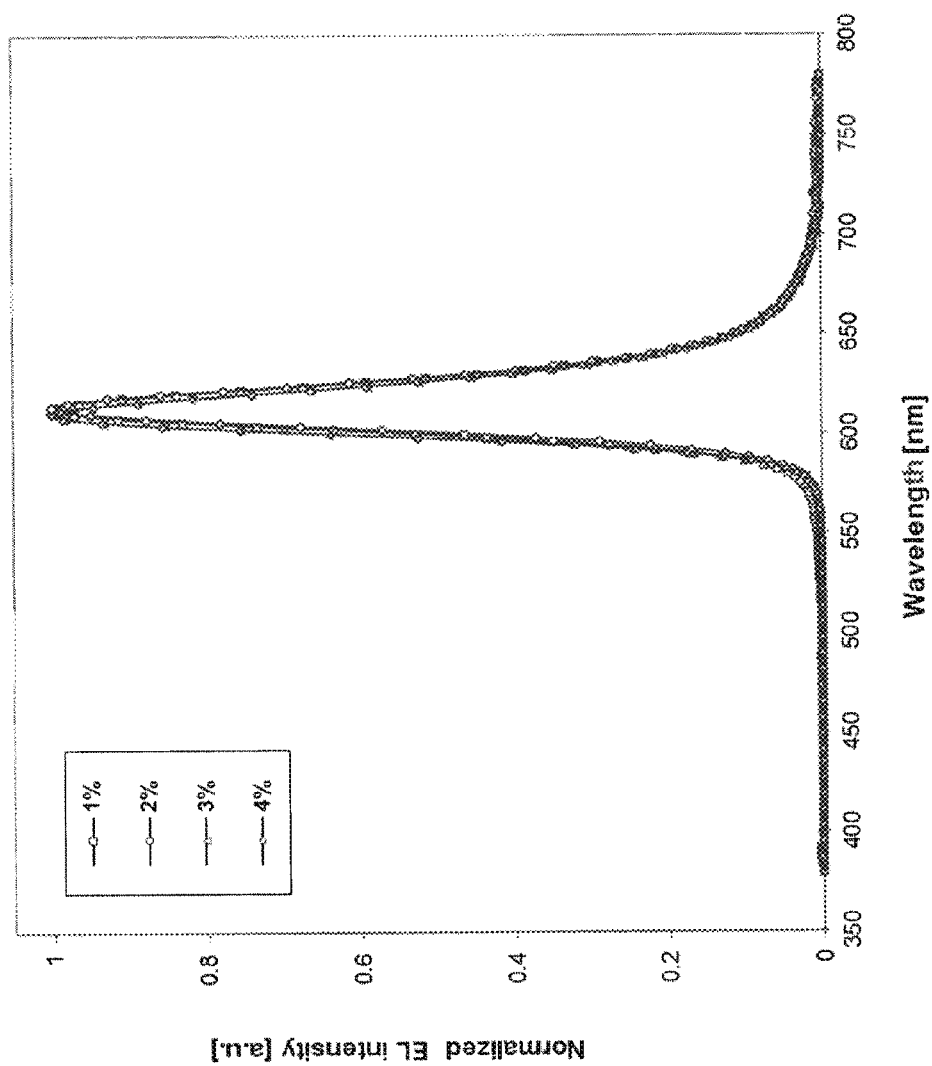
FIG. 10 shows the electroluminescence spectra of OLEDs in FIG. 7.

SD1 was present in an amount of 18 weight % and while the amount of RD1 was varied in each Model Device 1. Model Device 1-1 had 1 weight %. Model Device 1-2 had 2 weight %. Model Device 1-3 had 3 weight %. Model Device 1-4 had 4 weight %. Model Devices 1-1 to 1-4 also were constructed with micro-cavities. Table 2 shows the concentration of the compounds in the organic emissive layer of these Model Devices. FIG. 10 shows the electroluminescence spectra of Model Devices 1-1 to 1-4.

TABLE 2

Compounds in the organic emissive layer of Model Devices 1-1 to 1-4

| | EML (30 nm, doping %) | | |
|---|---|---|---|
| Model Device 1-1 | Compound H | Compound SD1 18% | Compound RD1 1% |
| Model Device 1-2 | Compound H | Compound SD1 18% | Compound RD1 2% |
| Model Device 1-3 | Compound H | Compound SD1 18% | Compound RD1 3% |
| Model Device 1-4 | Compound H | Compound SD1 18% | Compound RD1 4% |

Figure 8:
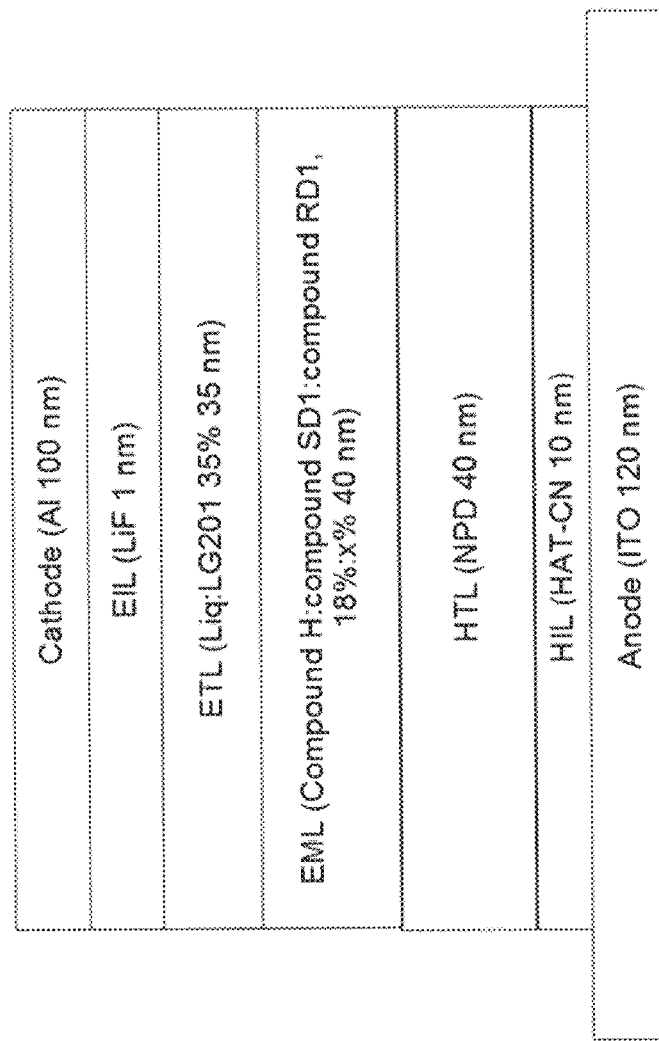
FIG. 8 shows a comparative example of an OLED without a micro-cavity with two dopants.
Figure 9:
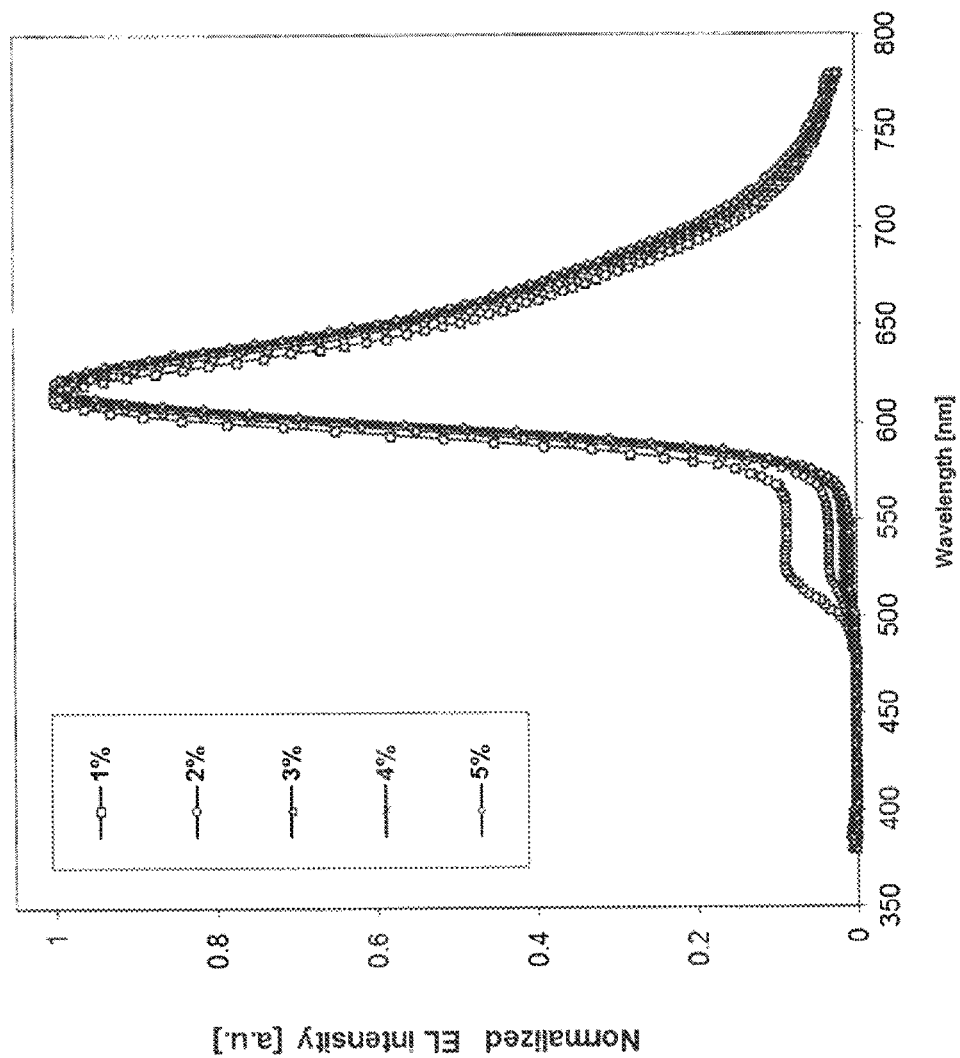
FIG. 9 shows the electroluminescence spectra of OLEDs in FIG. 8.

As a comparison, five other devices were made, comparative examples 2-1 to 2-5. All comparative examples are bottom emitting devices without micro-cavities as shown in FIG. 8. Comparative examples 2-1 to 2-4 have the similar structures as Model Devices 1-1 to 1-4. Comparative example 2-5 has a similar structure as Model Device 1-4, except that it has RD1 present in amount of 5 weight %. Table 3 summarizes the concentration of the compounds in the organic emissive layer of these comparative devices. FIG. 9 shows the electroluminescence spectra of the comparative examples 2-1 to 2-5.

TABLE 3

Compounds in the organic emissive layer of comparative examples 2-1 to 2-5

| | EML (30 nm, doping %) | | |
|---|---|---|---|
| Comparative Example 2-1 | Compound H | Compound SD1 18% | Compound RD1 1% |
| Comparative Example 2-2 | Compound H | Compound SD1 18% | Compound RD1 2% |
| Comparative Example 2-3 | Compound H | Compound SD1 18% | Compound RD1 3% |
| Comparative Example 2-4 | Compound H | Compound SD1 18% | Compound RD1 4% |

TABLE 3-continued

Compounds in the organic emissive layer of comparative examples 2-1 to 2-5

EML (30 nm, doping %)

| Comparative Example 2-5 | Compound H | Compound SD1 18% | Compound RD1 5% |
|---|---|---|---|

Table 4 shows device performances of Model Devices 1-1 to 1-4. Table 5 shows the device performances of Comparative Examples 2-1 to 2-5. These tables show the 1931 CIE, driving voltage (V), luminous efficacy (LE), external quantum efficiency (EQE) and power efficacy (PE) measured at 1,000 nits for each device.

With regards to the Comparative Devices, devices containing 18% doped SD1 and at least 3% doped RD1 in the emissive layer generally resulted in desirable light output emission. For example, as seen in FIG. 9, the EL spectra of Example 2-3 contained less than 5 area % green/yellow emission and covered a small color range of 1931 CIE (0.65, 0.34) to (0.66, 0.34). However, such devices also had low EQE as compared to devices with a higher amount of 3% doped RD1. For example, as shown in Table 5, Example 2-3 has 24.4% EQE. The EQE only decreases as the RD1 doping % is increased from 3% (Comparative Examples 2-4 and 2-5).

As shown in Table 5, devices containing 18% doped SD1 and less than 3% doped RD1 obtained higher EQE, i.e., 25.8% and 24.6% than the 24.4% or less of the more than 3% doped RD1. However, as seen in FIG. 9, these devices have a large contribution of green/yellow emission in the EL spectra, i.e. more than 5 area % of the emission, which is undesirable in some embodiments. Specifically, example 2-1 containing 18% doped SD1 and 1% doped RD1 in the emissive layer obtained 10 area % green/yellow of the emission and the 1931 CIE color coordinate was (0.62, 0.38).

Model Device 1-1 to 1-4, made consistent with the embodiments disclosed herein, achieve similar color coordinates as >3% doped RD1 described above due to cutting out the SD1 spectrum by the micro cavity effect. This can be seen in a comparison of FIGS. 9 and 10. Table 3 shows the device performances of Model Devices at 1,000 nits. The <3% doped Model Devices (1-1 and 1-2) obtained higher luminous efficacy, 63.2 cd/A at 2% doped RD1 (1-2) and 61.2 cd/A at 1% doped RD1 (1-1), respectively, than 58.8 cd/A or less vs. the more than 3% doped RD1 (Model Devices 1-3 and 1-4).

TABLE 4

Performance of Model Device 1 structures

| Device structure | 1931 CIE | | Voltage | LE |
|---|---|---|---|---|
| examples | x | y | [V] | [cd/A] |
| Model Device 1-1 | 0.66 | 0.34 | 3.6 | 61.2 |
| Model Device 1-2 | 0.66 | 0.34 | 3.5 | 63.2 |
| Model Device 1-3 | 0.66 | 0.34 | 3.5 | 58.8 |
| Model Device 1-4 | 0.66 | 0.34 | 3.5 | 56.7 |

TABLE 5

Performance of Comparative Example 2 structures

| Device structure | 1931 CIE | | At 1,000 nits | | |
|---|---|---|---|---|---|
| examples | x | y | Voltage [V] | LE [cd/A] | EQE [%] | PE [lm/W] |
| Comparative Example 2-1 | 0.62 | 0.38 | 3.4 | 37.2 | 24.6 | 34.5 |
| Comparative Example 2-2 | 0.64 | 0.35 | 3.4 | 33.2 | 25.8 | 30.3 |
| Comparative Example 2-3 | 0.65 | 0.34 | 3.4 | 29.0 | 24.4 | 26.6 |
| Comparative Example 2-4 | 0.66 | 0.34 | 3.4 | 27.8 | 24.4 | 25.6 |
| Comparative Example 2-5 | 0.66 | 0.34 | 3.4 | 26.0 | 23.8 | 24.0 |

Model Devices 3-1 to 3-3: Top Emitting Devices with Three Components

Figure 11:
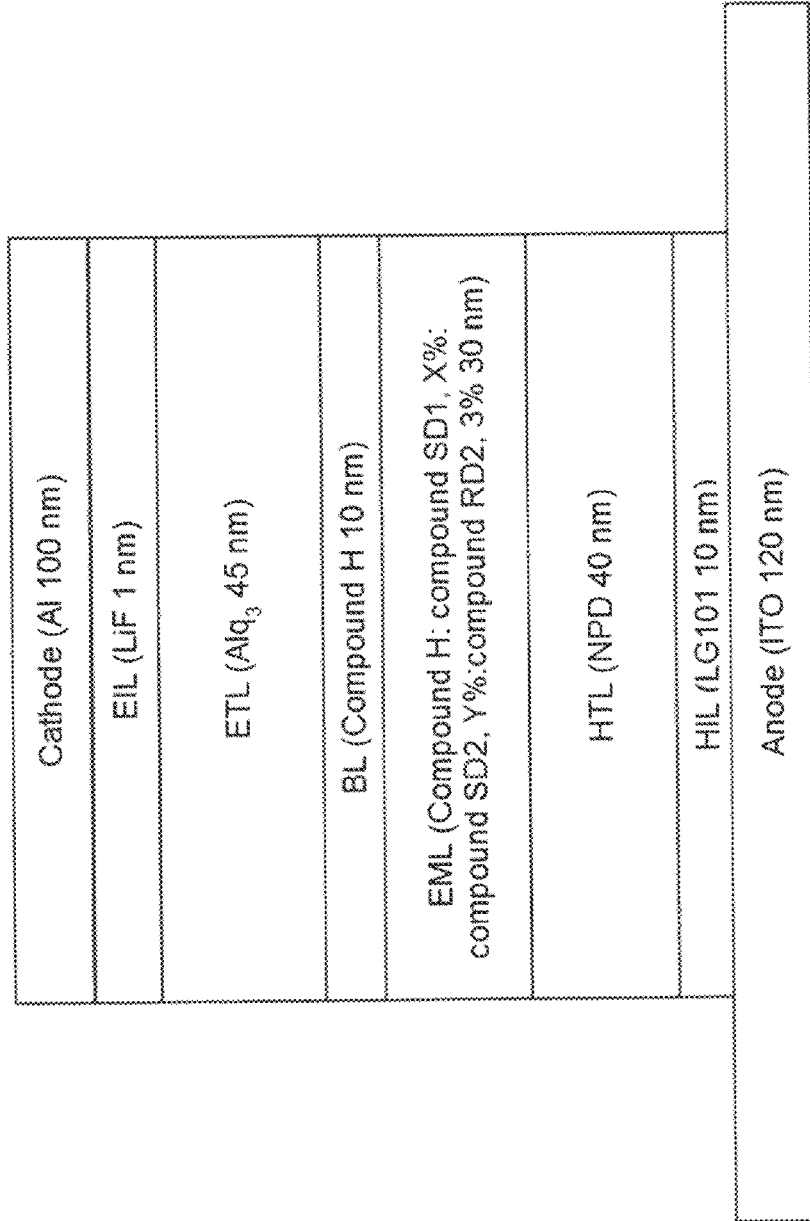
FIG. 11 shows an exemplary structure of an OLED with three dopants.

As more non-limiting examples, Model Devices 3-1 to 3-3 were constructed. Model Devices 3-1 to 3-3 are top emitting devices with micro-cavities and their structures are shown in representative FIG. 11. Model Devices 3-1 to 3-3 consists of, sequentially, from the ITO surface, 10 nm of LG101 (purchased from LG Chem) as the hole injection layer (HIL), 40 nm of 4,4'-NPD as the hole transporting layer (HTL), 30 nm of organic emissive layer comprising of host compound H doped with compound SD1, compound SD2 and compound RD2, 10 nm of compound H as a blocking layer (BL), and 45 nm of tris-8-hydroxyquinoline aluminum ($Alq_3$) as the electron transport layer. As used herein, compounds SD2, RD2, and $Alq_3$ have the chemical structures shown below.

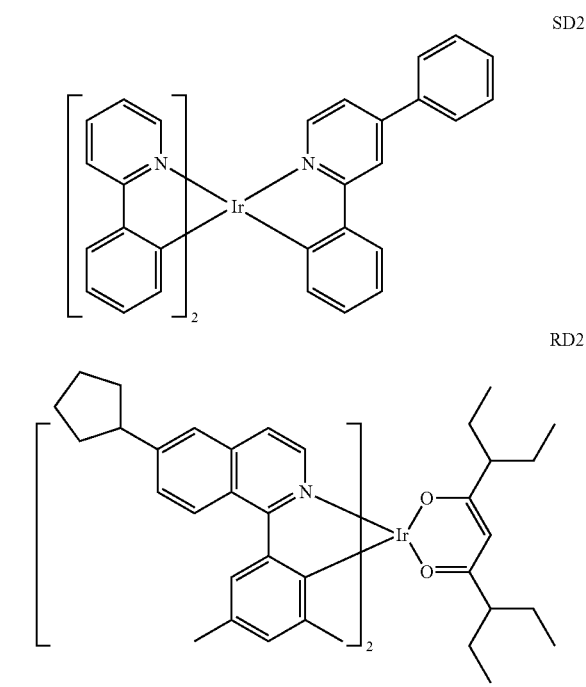

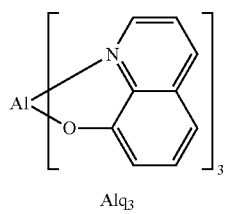

Alq₃

Model Devices 3-1 to 3-3 all contain RD2 in an amount of 3 weight % and SD1 in an amount of 12 weight %. The amount of SD2, however, is varied. Model Device 3-1 contains SD2 in an amount 6 weight %. Model Device 3-2 contains SD2 in an amount 12 weight %. Model Device 3-3 contains SD2 in an amount 18 weight %.

Comparative examples CE 4-1 to CE 4-4 and CE 5-1 to CE 5-3 were also constructed. These comparative examples are similar to Model Devices 3-1 in structure, except that CE 4-1 to CE 4-4 contain no SD2 and varying amounts of SD1 and CE 5-1 to CE 5-3 contain no SD1 and varying amounts of SD2. Table 6 shows phosphorescent OLED structures of the Model Devices and comparative examples.

TABLE 6

Compounds in the organic emissive layer of Model Device 3 and Comparative Examples EML (30 nm, doping %)

| | | | | |
|---|---|---|---|---|
| Model Device 3-1 | Compound H | Compound SD1 12% | Compound SD2 6% | Compound RD2 3% |
| Model Device 3-2 | Compound H | Compound SD1 12% | Compound SD2 12% | Compound RD2 3% |
| Model Device 3-3 | Compound H | Compound SD1 12% | Compound SD2 18% | Compound RD2 3% |
| Comparative Example 4-1 | Compound H | Compound SD1 6% | | Compound RD2 3% |
| Comparative Example 4-2 | Compound H | Compound SD1 12% | | Compound RD2 3% |
| Comparative Example 4-3 | Compound H | Compound SD1 18% | | Compound RD2 3% |
| Comparative Example 4-4 | Compound H | Compound SD1 24% | | Compound RD2 3% |
| Comparative Example 5-1 | Compound H | | Compound SD2 12% | Compound RD2 3% |
| Comparative Example 5-2 | Compound H | | Compound SD2 18% | Compound RD2 3% |
| Comparative Example 5-3 | Compound H | | Compound SD2 24% | Compound RD2 3% |

Table 7 summarizes the performance of these devices. The driving voltage (V), luminous efficacy (LE), and external quantum efficiency (EQE) were measured at 10,000 nits, while the lifetime ($LT_{80\%}$) was defined as the time required for the device to decay to 80% of its initial luminance ($L_0$) under a constant current density of 80 mA/cm² at room temperature.

TABLE 7

Performance of Model Device 3 and Comparative Examples

| | 1931 CIE | | At 10,000 nits | | | At 80 mA/cm² | |
|---|---|---|---|---|---|---|---|
| | CIE x | CIE y | Voltage [V] | LE [cd/A] | EQE [%] | Lo [nits] | $LT_{80\%}$ [h] |
| Model Device 3-1 | 0.66 | 0.33 | 8.1 | 20 | 21 | 14,975 | 258 |
| Model Device 3-2 | 0.66 | 0.34 | 7.9 | 20 | 20 | 14,746 | 260 |
| Model Device 3-3 | 0.66 | 0.34 | 8.0 | 17 | 17 | 12,854 | 257 |
| Comparative Example 4-1 | 0.67 | 0.33 | 10.1 | 13 | 15 | 10,177 | 131 |
| Comparative Example 4-2 | 0.67 | 0.33 | 8.8 | 18 | 20 | 13,627 | 212 |
| Comparative Example 4-3 | 0.67 | 0.33 | 8.5 | 18 | 20 | 13,576 | 227 |
| Comparative Example 4-4 | 0.67 | 0.33 | 8.2 | 17 | 18 | 12,805 | 228 |
| Comparative Example 5-1 | 0.68 | 0.32 | 9.3 | 16 | 18 | 12,298 | 208 |
| Comparative Example 5-2 | 0.67 | 0.33 | 8.4 | 18 | 20 | 13,830 | 236 |
| Comparative Example 5-3 | 0.67 | 0.33 | 8.2 | 17 | 18 | 12,914 | 224 |

All of the devices including comparative examples 4-1 to 4-4 and 5-1 to 5-3 has EL spectra characteristic of emission from compound RD2 i.e. with 1931 CIE coordinates x=0.66 to 0.68 and y=0.32 to 0.33.

Comparative Example 4-3, which has 18% doped compound SD1 and 3% doped compound RD2 in the organic emissive layer, exhibited the best device performance, 8.5V, 20% EQE, and 227 hours of $LT_{80}$% among comparative examples in the same family the "4" family).

Comparative Example 5-2, which has 18% doped compound SD2 and 3% doped compound RD2 in EML, exhibited the best device performance, 8.4V, 20% EQE, and 236 hours of $LT_{80}$% among comparative examples in the same family (the "5" family).

Model Device 3-1, which has 12% doped compound SD1, 6% doped compound SD2 and 3% doped compound RD2 in organic emissive layer, achieved lower voltage, higher EQE at 10,000 nits and longer LT80% at 80 mA/cm² than comparative examples 4-3 and 5-2. One of ordinary skill in the art would not have expected this result.

Figure 12:
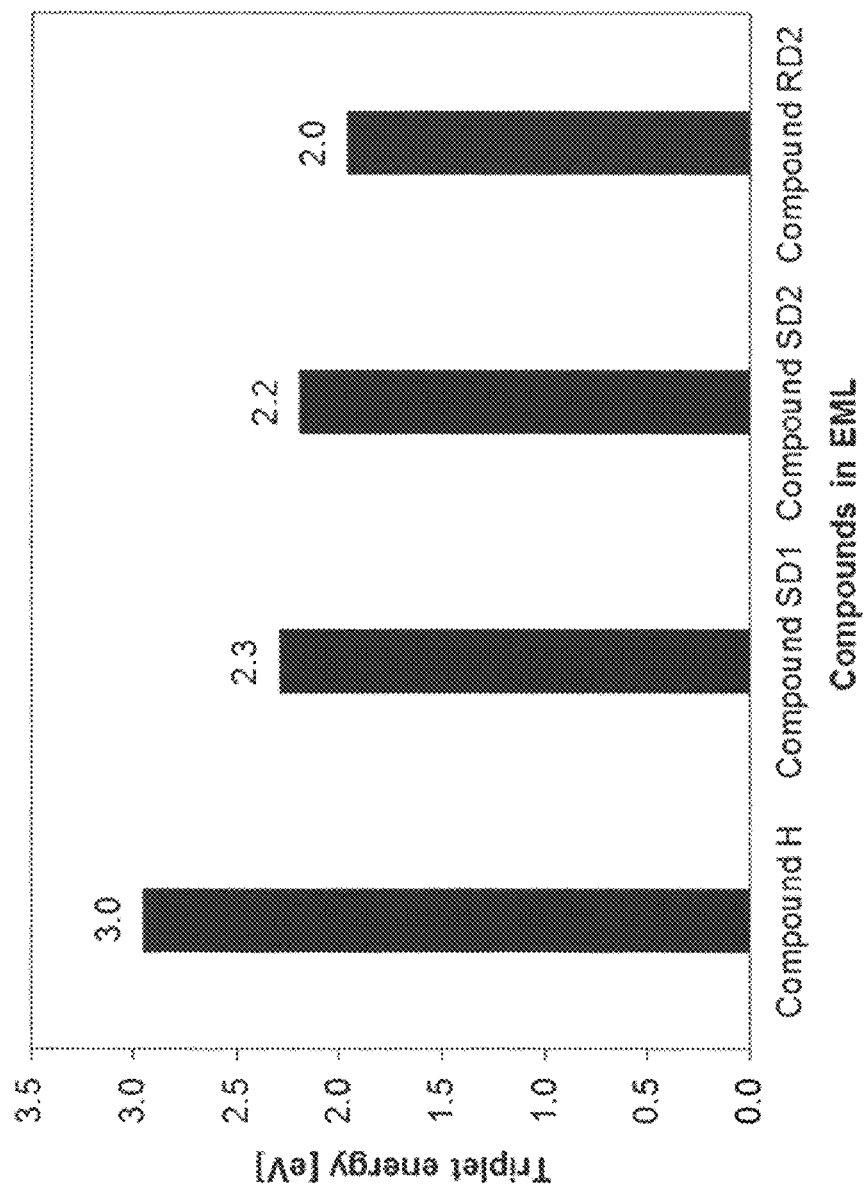
FIG. 12 shows the triplet energy of the compounds used in OLED shown in FIG. 11.

The triplet energy diagram of the compounds in the organic emissive layer is shown in FIG. 12. One possible mechanism is that excitons may be formed on the green (SD1) and or yellow (SD2) and are then transferred to compound RD2 where they then can result in red emission. This may be a reason for the improvement of the device performance.

Figure 13:
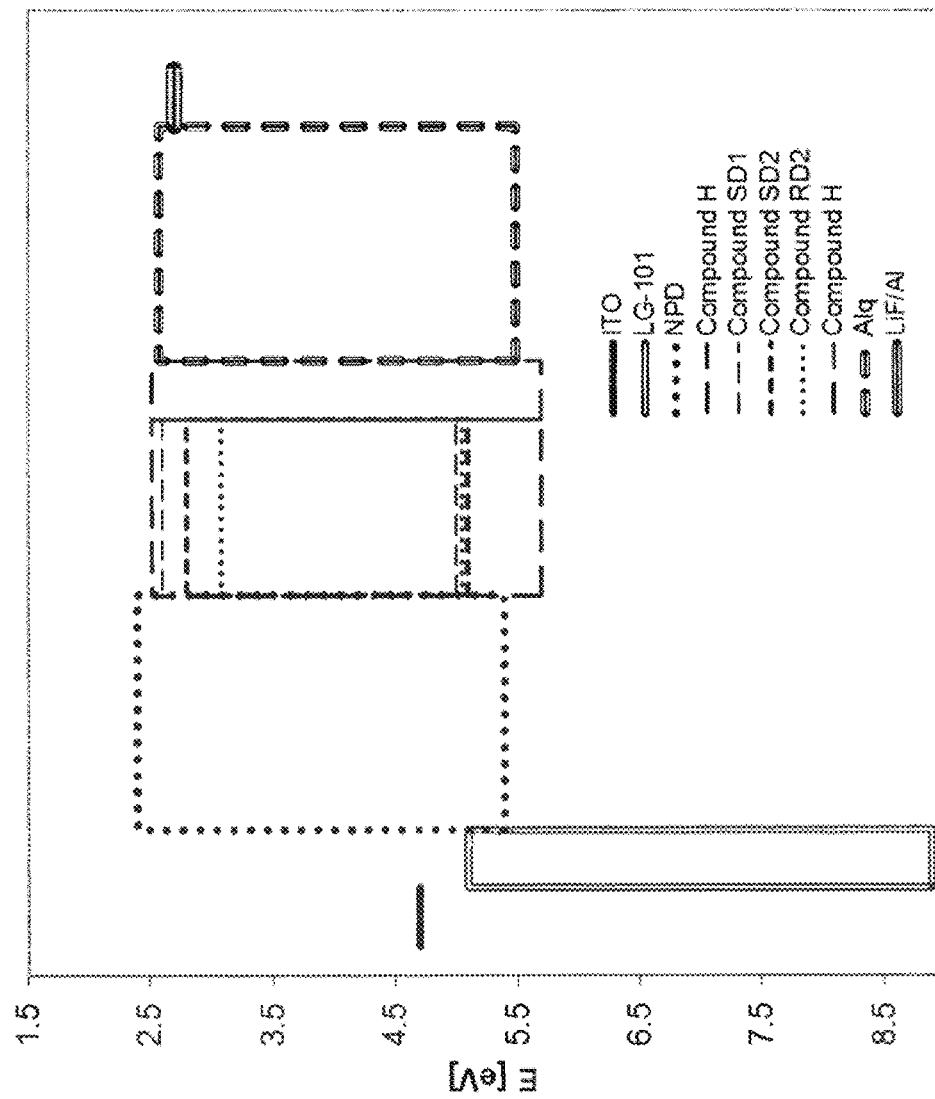
FIG. 13 shows the energy diagram of OLED shown in FIG. 11.

The energy diagram of compounds for the device structure is shown in FIG. 13. Highest occupied molecular orbital (HOMO) and lowest unoccupied molecular orbital (LUMO) for each compound are shown in the diagram. Since compound H has a relatively deeper HOMO (~5.7 eV) than compounds SD1, SD2 and RD2 (~5.0 to ~5.1 eV), holes can be directly tapped and transported on compounds SD1, SD2 and RD2 in the EML. The LUMOs of compound H, SD1, SD2 and RD2 are ~2.52 eV, ~2.6 eV, ~2.8 eV, and ~3.1 eV, respectively. Compound SD1 has been disclosed as a hole injection material in US 2011/0057171 A1. This supports compound SD1 function as a hole transporting material.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A device, comprising
an anode;
a cathode; and
an organic emissive layer disposed between the anode and the cathode comprising:
a host;
a first compound capable of phosphorescent emission at room temperature present in an amount less than 3 weight %, the first compound having a global maximum in its visible emission spectrum at a first wavelength;
a second compound capable of phosphorescent emission at room temperature, the second compound having a global maximum in its visible emission spectrum at a second wavelength, the first wavelength longer than the second wavelength;
wherein the first compound, the second compound and the host are mixed in the emissive layer; and
a suppression mechanism capable of preferentially reducing emission of light emitted by the second compound;
wherein the difference between the first wavelength and the second wavelength is between 0 nm and 80 nm.

2. The device of claim 1, wherein the intensity of light emitted by the device at the second wavelength divided by the intensity of light emitted by the device at the first wavelength is less than 0.01.

3. The device of claim 1, wherein the difference between the first wavelength and the second wavelength is between 20 nm and 80 nm.

4. The device of claim 1, wherein the difference between the first wavelength and the second wavelength is between 40 nm and 80 nm.

5. The device of claim 1, wherein: the first compound is capable of red phosphorescent emission, and the first wavelength is in the range 590-700 nm.

6. The device of claim 5, wherein the second wavelength is in the range 510-590 nm.

7. The device of claim 1, wherein the device emits light having a 1931 CIE coordinate of [0.66±0.04, 0.34±0.04].

8. The device of claim 1, wherein: the first compound is capable of yellow phosphorescent emission, and the first wavelength is in the range 560-590 nm.

9. The device of claim 8, wherein the second wavelength is in the range 480-560 nm.

10. The device of claim 8, wherein the device emits light having a 1931 CIE coordinate of [0.44±0.04, 0.55±0.04].

11. The device of claim 1, wherein: the first compound is capable of green phosphorescent emission, and the first wavelength is in the range 500-560 nm.

12. The device of claim 11, wherein the second wavelength is in the range 420-500 nm.

13. The device of claim 11, wherein the device emits light having a 1931 CIE coordinate of [0.25±0.15, 0.65±0.15].

14. The device of claim 1, wherein the suppression mechanism is selected from the group consisting of a micro-cavity, down-conversion filter, and an optical filter.

15. The device of claim 1, wherein the first compound is present in an amount between 1 to 2.5 weight %.

16. The device of claim 1, wherein the emissive layer does not include any compound capable of phosphorescent emission at room temperature other than the first and second compounds.

17. A device, comprising:
an anode;
a cathode; and
an organic light emission layer disposed between the anode and the cathode comprising:
a host;
a first compound capable of phosphorescent emission at room temperature present in an amount less than 3 weight %, the first compound having a having a global maximum in its visible emission spectrum at a first wavelength;
a second compound capable of phosphorescent emission at room temperature, the second compound having a global maximum in its visible emission spectrum at a second wavelength, the first wavelength longer than the second wavelength;
a third compound capable of phosphorescent emission at room temperature, the third compound having a global maximum in its visible emission spectrum at a third wavelength, the second wavelength longer than the third wavelength;
wherein the first compound, the second compound, the third compound and the host are mixed in the emissive layer; and
a suppression mechanism capable of preferentially reducing emission of light emitted by the second compound and the third compound.

18. A device, comprising
an anode;
a cathode; and
an organic light emission layer disposed between the anode and the cathode comprising:
a host;
a first compound capable of phosphorescent emission at room temperature present in an amount less than 3 weight %, the first compound having a global maximum in its visible emission spectrum at a first wavelength;
a second compound capable of phosphorescent emission at room temperature, the second compound having a global maximum in its visible emission spectrum at a second wavelength, the first wavelength longer than the second wavelength;
wherein the first compound, the second compound and the host are mixed in the emissive layer; and
a suppression mechanism capable of preferentially reducing emission of light emitted by the second compound;
wherein the difference between the first wavelength and the second wavelength is between 40 and 80 nm.

* * * * *

UNITED STATES PATENT AND TRADEMARK OFFICE
CERTIFICATE OF CORRECTION

| | | |
|---|---|---|
| PATENT NO. | : 9,450,198 B2 | Page 1 of 1 |
| APPLICATION NO. | : 14/253804 | |
| DATED | : September 20, 2016 | |
| INVENTOR(S) | : Hitoshi Yamamoto et al. | |

It is certified that error appears in the above-identified patent and that said Letters Patent is hereby corrected as shown below:

In the Specification
In Column 6, Line 66, delete the second "sulfanyl" and insert -- sulfinyl --

Signed and Sealed this
Second Day of May, 2017

Michelle K. Lee
*Director of the United States Patent and Trademark Office*